(12) United States Patent
Kawasaki et al.

(10) Patent No.: US 7,217,605 B2
(45) Date of Patent: May 15, 2007

(54) LASER IRRADIATION METHOD AND METHOD OF MANUFACTURING A SEMICONDUCTOR DEVICE

(75) Inventors: Ritsuko Kawasaki, Tokyo (JP); Setsuo Nakajima, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 512 days.

(21) Appl. No.: 09/988,389

(22) Filed: Nov. 19, 2001

(65) Prior Publication Data

US 2004/0161913 A1    Aug. 19, 2004

(30) Foreign Application Priority Data

Nov. 29, 2000 (JP) .............................. 2000-362036
Dec. 26, 2000 (JP) .............................. 2000-394977

(51) Int. Cl.
*H01L 21/00* (2006.01)
(52) U.S. Cl. ........................................ 438/160; 257/72
(58) Field of Classification Search ................ 438/149, 438/151, 156–166, 378, 795, 486–488; 257/51, 257/52, 57, 66, 72
See application file for complete search history.

(56) References Cited

U.S. PATENT DOCUMENTS 5,643,826 A    7/1997    Ohtani et al.

(Continued)

FOREIGN PATENT DOCUMENTS

| JP | 59-099434 | 7/1984 |
| JP | 62-007691 | 1/1987 |
| JP | 06-132306 | 5/1994 |
| JP | 07-183540 | 7/1995 |
| JP | 10-178178 | 6/1998 |
| JP | 10-270363 | 10/1998 |
| JP | 2002-323428 | 11/2000 |
| JP | 2001-284250 | 10/2001 |

OTHER PUBLICATIONS

Specification and drawings for related U.S. Appl. No. 09/635,422.

(Continued)

*Primary Examiner*—David Vu
(74) *Attorney, Agent, or Firm*—Eric J. Robinson; Robinson Intellectual Property Law Office, P.C.

(57) ABSTRACT

A crystalline semiconductor film having crystal grains of large grain size or crystal grains in which the position and the size are controlled is formed to manufacture a TFT, whereby a semiconductor device that enables a high-speed operation is realized. First, a reflecting member is provided on a rear surface side of a substrate on which a semiconductor film is formed (semiconductor film substrate). When a front surface side of the semiconductor film substrate is irradiated with a laser beam that penetrates the semiconductor film substrate, the laser beam is reflected by the reflecting member to irradiate the semiconductor film from the rear surface side. With this method, an effective energy density is raised in the semiconductor film, and an output time is made long. Thus, the cooling rate of the semiconductor film is made gentle and crystal grains of large grain size are formed. Further, the front surface side of the semiconductor film substrate is irradiated with the laser beam by using a substrate on which a reflecting layer is partially formed as the reflecting member, whereby the semiconductor film is partially irradiated with the laser beam from the rear surface side. Thus, a temperature distribution is generated in the semiconductor film, and the location where a lateral growth is generated and the lateral direction can be controlled. Therefore, the crystal grains of large grain size can be obtained.

60 Claims, 26 Drawing Sheets

U.S. PATENT DOCUMENTS

| | | |
|---|---|---|
| 5,923,962 A | 7/1999 | Ohtani et al. |
| 6,285,042 B1 | 9/2001 | Ohtani et al. |
| 6,393,042 B1 | 5/2002 | Tanaka |
| 6,410,368 B1 * | 6/2002 | Kawasaki et al. .......... 438/145 |
| 6,426,245 B1 | 7/2002 | Kawasaki et al. |
| 6,489,222 B2 | 12/2002 | Yoshimoto |
| 6,599,788 B1 * | 7/2003 | Kawasaki et al. .......... 438/158 |
| 6,744,008 B1 * | 6/2004 | Kasahara et al. ...... 219/121.65 |
| 6,818,568 B2 | 11/2004 | Tanaka |
| 2001/0015441 A1 | 8/2001 | Kawasaki et al. |
| 2001/0055830 A1 | 12/2001 | Yoshimoto |
| 2002/0017685 A1 | 2/2002 | Kasahara et al. |
| 2002/0094613 A1 | 7/2002 | Yamazaki et al. |
| 2002/0146873 A1 | 10/2002 | Tanka |

OTHER PUBLICATIONS

Specification and drawings for related U.S. Appl. No. 09/695,410.
Specification and drawings for related U.S. Appl. No. 09/696,165.

* cited by examiner

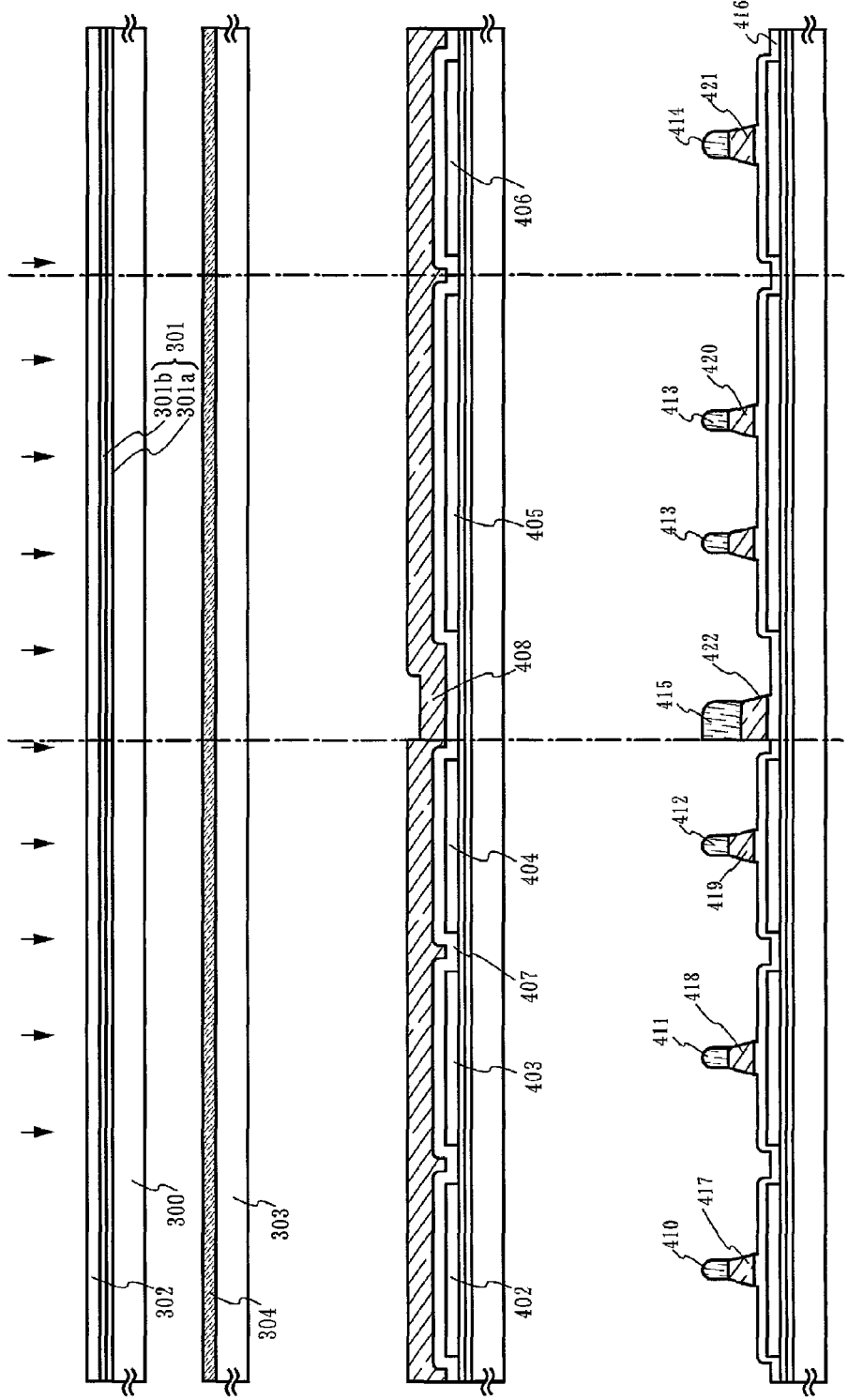

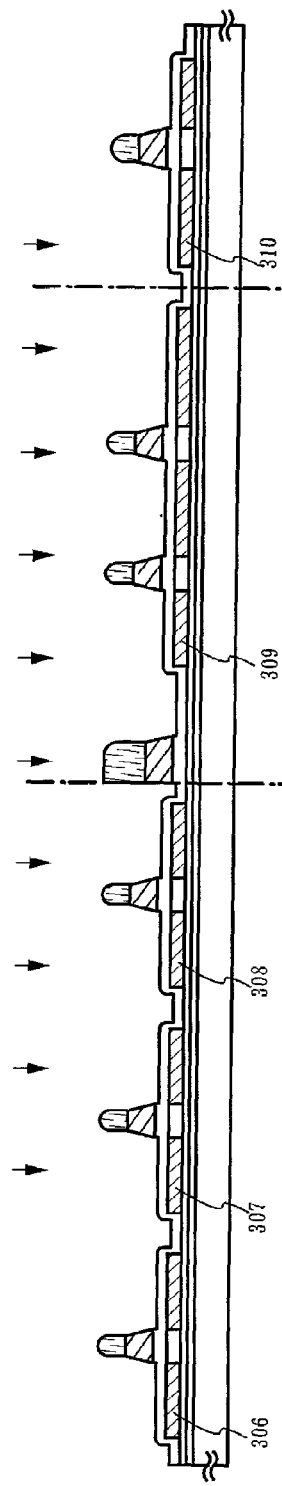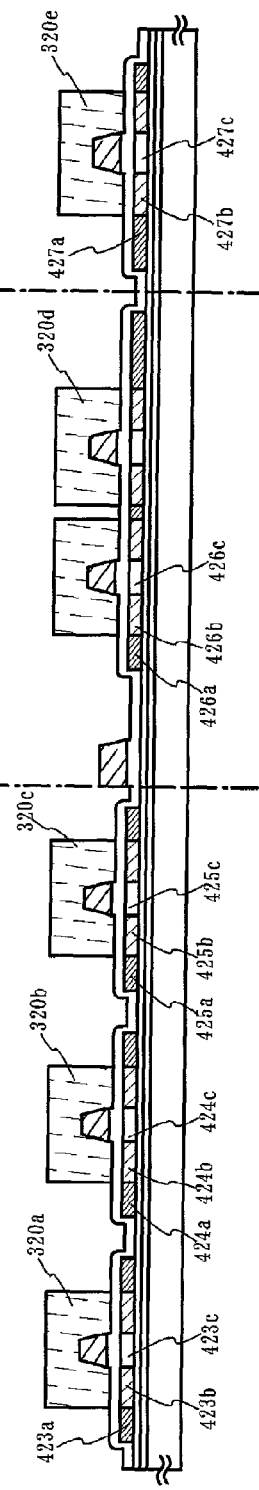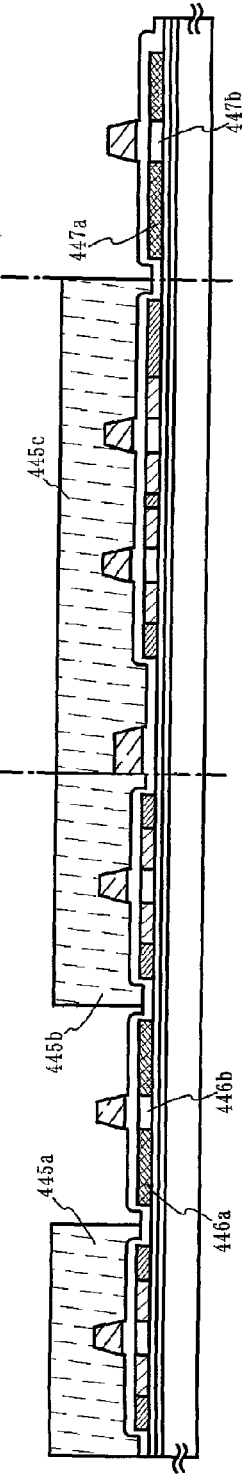

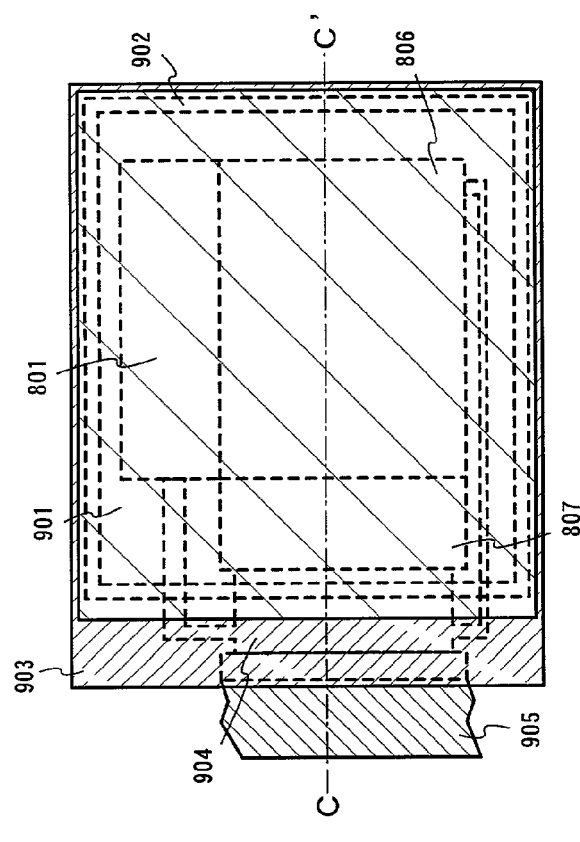
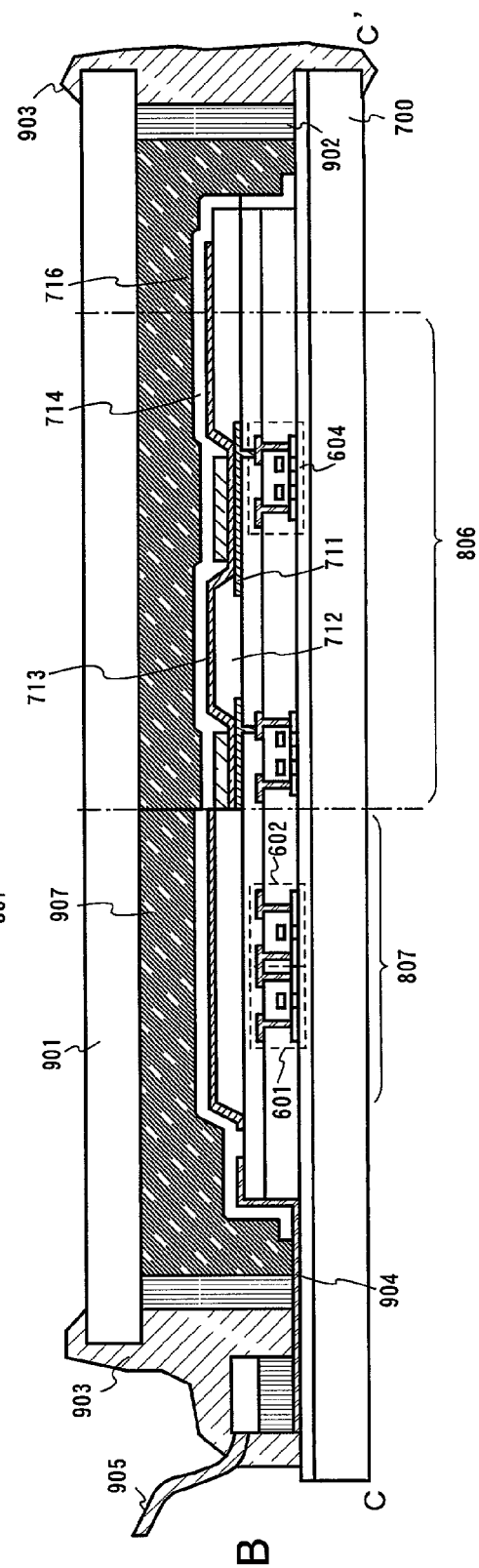
Fig. 16A
Fig. 16B

Fig. 22A
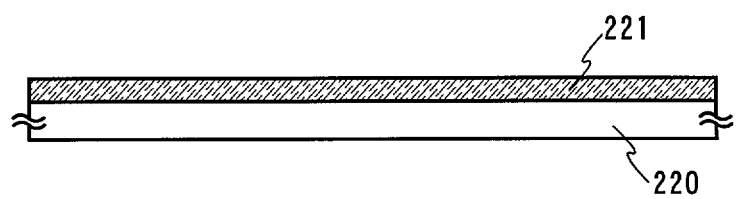
Fig. 22B
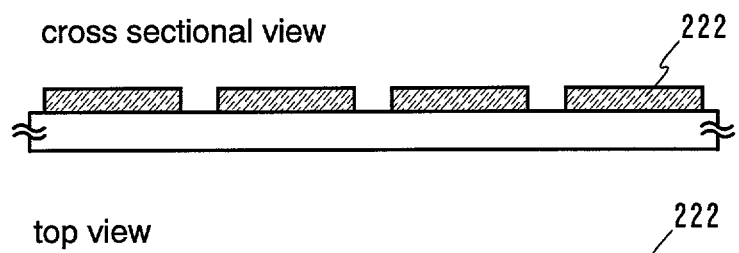
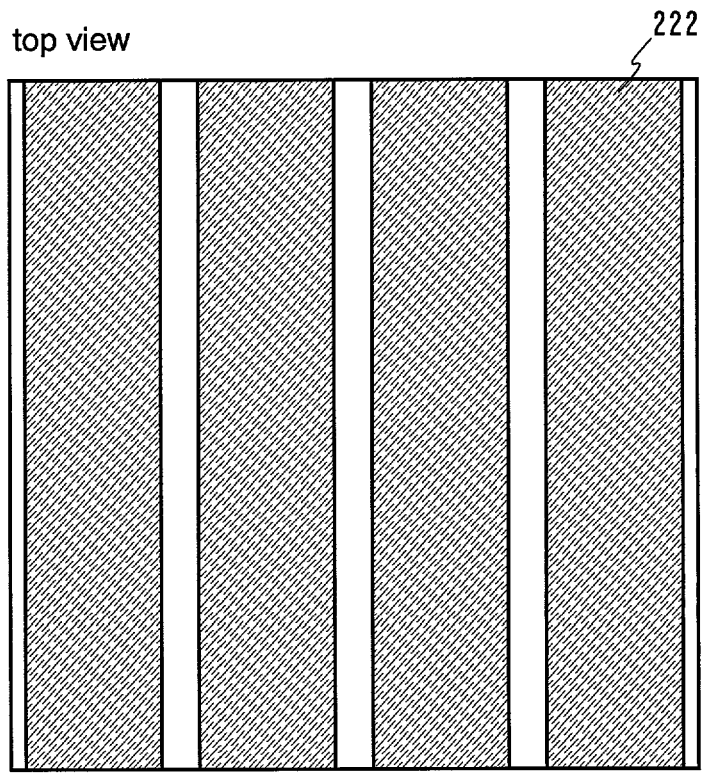
Fig. 23
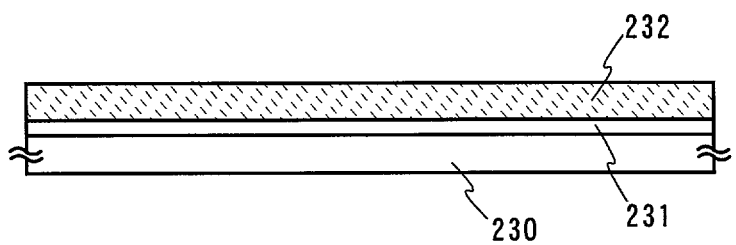

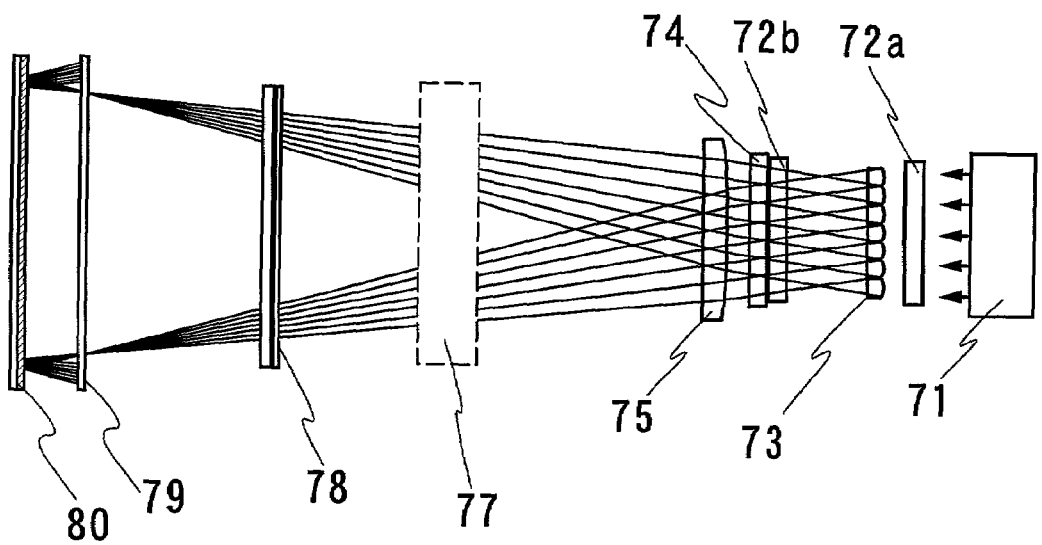
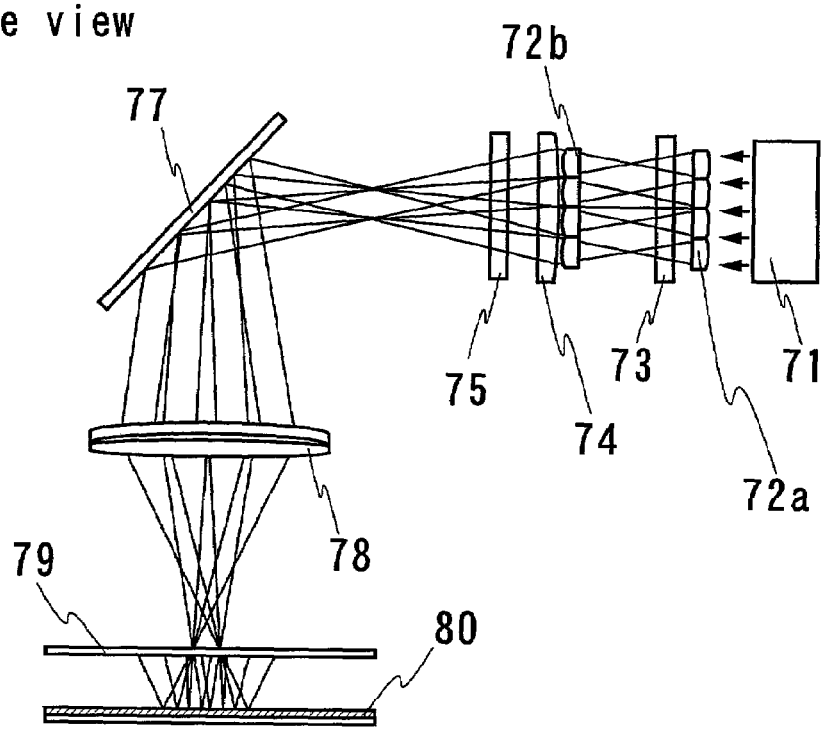
Fig. 28

LASER IRRADIATION METHOD AND METHOD OF MANUFACTURING A SEMICONDUCTOR DEVICE

BACKGROUND OF THE INVENTION

1. Field of the Invention

The present invention relates to a laser irradiation method of annealing a semiconductor film using a laser beam (hereinafter referred to as laser annealing) and a laser irradiation apparatus for performing the laser annealing (apparatus including a laser and an optical system for guiding a laser beam output from the laser to a member to be processed). Further, the present invention relates to a semiconductor device manufactured by the steps including the laser annealing step and a method of manufacturing the semiconductor device. Note that the semiconductor device mentioned through the specification includes an electro-optical device such as a liquid crystal display device or a light emitting device and an electronic device including the electro-optical device as its component.

2. Description of the Related Art

In recent years, techniques of crystallizing a semiconductor film formed on an insulating substrate such as a glass substrate or improving the crystallinity thereof by performing laser annealing have been widely studied. Silicon is often used for the semiconductor film.

The glass substrate is at low cost and has a lot of processability in comparison with a synthetic quartz glass substrate that has been conventionally used in many cases, and has an advantage that it easily enables the manufacture of a substrate with large area. This is a reason that the above-mentioned study is made. Further, the reason a laser is used in crystallization from choice is that the melting point of the glass substrate is low. Laser can give high energy only to the semiconductor film without largely raising the temperature of the substrate.

Since a crystalline semiconductor is formed of a large number of crystal grains, it is also called a polycrystalline semiconductor film. The crystalline semiconductor film formed by performing laser annealing has high mobility, and thus, a thin film transistor (TFT) is formed using the crystalline semiconductor film. For example, the TFT is widely used for a monolithic liquid crystal electro-optical device or the like in which TFTs for a pixel portion and for a driver circuit are formed on a glass substrate.

Further, the method, in which a pulse laser beam of an excimer laser or the like with large output is processed in an optical system so as to have a shape of a spot of several by several centimeters square or a linear shape of 10 cm length or more on an irradiation surface, the laser beam is scanned (or the irradiation position of the laser beam is made to move relatively to a surface to be irradiated), and laser annealing is performed, attains high mass production and is excellent from the industrial viewpoint. Thus, the method is used from choice.

In particular, when the linear beam is used, laser irradiation can be conducted over the entire irradiation surface with scanning only in a direction perpendicular to the longitudinal direction of the linear beam, which is different from the case where the spot laser beam that requires scanning in the front and rear directions and in the right and left directions is used, which leads to high mass production. The reason the scanning is performed in the direction perpendicular to the longitudinal direction is that the direction is most effective. Owing to the high mass production, the laser annealing method in which the linear laser beam that is obtained by processing a pulse oscillation excimer laser beam in an appropriate optical system is used currently becomes the main stream of a manufacturing technique of a liquid crystal display device using a TFT.

However, the crystalline semiconductor film manufactured by the laser annealing method is formed from a plurality of crystal grains, and the position and the size of the crystal grains are random. The TFT manufactured on the glass substrate is formed by separating the crystalline semiconductor film with island-like patterning in order to realize element isolation. In this case, the crystalline semiconductor film can not be formed with the designation of the position and the size of the crystal grains. There exist numerous recombination centers and trapping centers which derive from an amorphous structure, a crystal defect or the like exist in an interface of the crystal grain (crystal grain boundary) compared with the inside of the crystal grain. It is known that when a carrier is trapped in the trapping center, the potential of the crystal grain boundary rises, which becomes a barrier to the carrier, whereby the current transporting property of the carrier is lowered. The crystallinity of the semiconductor film in a channel forming region has a great effect on the characteristic of the TFT. However, it is hardly possible that the channel forming region is formed of a single crystal semiconductor film without influence of the crystal grain boundary.

Further, it is known that growth distance of the crystal grain is in proportion to the product of a crystallization time by a growth rate. Here, the crystallization time indicates the time until the completion of crystallization of a semiconductor film from the generation of a crystal nucleus in the semiconductor film. Further, assuming that the time until the completion of crystallization from melting of the semiconductor film is a melting time, if a cooling rate of the semiconductor film is made gentle by extending the melting time, the crystallization time becomes longer. Thus, the crystal grain of a large grain size can be formed.

In order to form the channel forming region by the single crystal semiconductor film without influence of the crystal grain boundary, various attempts for forming the position-controlled crystal grain of large grain size are made in the laser annealing method. First, a solidifying process of the semiconductor film that has been subjected to irradiation of a laser beam is explained.

It takes time in a degree until solid phase nucleation occurs in a liquid semiconductor film that has been completely melted by laser beam irradiation. Numberless and uniform (or nonuniform) nucleations occur and grow in a completely melted region, whereby the solidifying process of the liquid semiconductor film is completed. Obtained in this case are crystal grains which are random in position and size.

Further, in the case where the semiconductor film is not completely melted by the laser beam irradiation and solid phase semiconductor regions remain partially, crystal growth begins at the solid phase semiconductor regions immediately after the laser beam irradiation. As described above, it takes time in a degree until the nucleation occurs in the completely melted region. Thus, a solid-liquid interface, which is the tip of the crystal growth, moves in a horizontal direction to the surface of the semiconductor film (hereinafter referred to as lateral direction) until the nucleation occurs in the completely melted region, whereby the crystal grain grows several tens of times as long as the film thickness. This growth ends with the occurrence of numberless and uniform (or nonuniform) nucleations in the completely melted region. Hereinafter, this phenomenon is referred to as a super lateral growth.

In an amorphous semiconductor film or a polycrystalline semiconductor film as well, an energy region of a laser beam where the super lateral growth is realized, exists. However, the above-mentioned energy region is very narrow, and the position where a large crystal grain is obtained can not be controlled. Further, the regions except for the region of the large crystal grain are microcrystalline regions where numerous nucleations occur or amorphous regions.

As described above, if a temperature gradient in the lateral direction can be controlled (a heat flow is made to occur in the lateral direction) in the laser beam energy region in which the semiconductor film is completely melted, the growth position and the growth direction of the crystal grain can be controlled. Various attempts are carried out in order to realize this method.

For example, James S. Im et al. of Columbia University show a sequential lateral solidification method (hereinafter referred to as SLS method) in which a super lateral growth is realized at an arbitrary location. In the SLS method, a slit-shape mask is shifted every shot by a distance (approximately 0.75 μm) in which the super lateral growth is conducted to perform crystallization.

Further, Matsumura, M. et al. of Tokyo Institute of Technology announced a method of forming position-controlled crystal grains of large grain size in the 47th Applied Physics Association Lectures. In the method, an insulating layer of which an upper surface has a square shape is embedded in an amorphous silicon film, and an insulating film is formed on the amorphous silicon film. In conducting irradiation of a laser beam, energy of the laser beam is made to have a gradient by using a phase shift mask, and the portion above the insulating layer is irradiated with the laser beam with low energy. That is, the amorphous silicon film below the insulating layer is cooled most fast and crystal nuclei are generated there after the irradiation of the laser beam because of a light shielding effect of the insulating layer and the energy gradient due to the phase shift mask. On the other hand, since the amorphous silicon film of other regions is still in a melted state, the crystal nuclei grow to the melted region and the crystal grains of large grain size which are position-controlled are formed.

There are various kinds of laser beams, and in general, crystallization is conducted using a laser beam of which a light source is a pulse oscillation type excimer laser (hereinafter referred to as excimer laser beam). The excimer laser has an advantage that it has large output and repeat irradiation with high frequency is possible. Further, the excimer laser beam has an advantage that an absorption coefficient to a silicon film is high.

KrF (248 nm wavelength) or XeCl (308 nm wavelength) is used as an excitation gas in order to form the excimer laser beam. However, gases such as Kr (krypton) and Xe (xenon) are very costly. Thus, there is a problem in that an increase of manufacturing cost is incurred with the high frequency of gas exchange.

Further, an exchange of attached devices such as a laser tube for conducting laser oscillation and a gas refining device for removing an unnecessary compound generated in an oscillation process is needed once in two to three years. Many of these attached devices are expensive, and there is also a problem in that the increase of manufacturing cost is incurred.

As described above, a laser irradiation apparatus using the excimer laser beam has high performance, indeed. However, the maintenance involves a lot of trouble, and also, there is a defect that the laser irradiation apparatus has high running cost (here, the running cost indicates the cost generated with operation) as a laser irradiation apparatus for mass production.

Then, in order to realize a laser irradiation apparatus with running cost lower than that of the excimer laser and a laser annealing method using the laser irradiation apparatus, there is a method of using a solid laser (a laser that outputs a laser beam with a crystal rod as a resonant cavity).

The reason for the use of the method is that the present solid laser has large output but has a very short output time. There are LD (laser diode) excitation, flush lamp excitation and the like as excitation methods of the solid laser. A large current needs to be flown through the LD in order to obtain large output by the LD excitation. Therefore, the life of the LD becomes short, and as a result, the LD excitation costs highly in comparison with the flash lamp excitation. Because of the above reason, most of solid lasers for the LD excitation have small output, and are in the development stage for attaining industrial lasers with large output in the present situation. On the other hand, a flash lamp can emit very strong light. Thus, the laser excited by the flash lamp has large output. However, in the oscillation by the flash lamp excitation, electrons excited by instantaneously input energy are released all at once, and thus, the laser output time becomes very short. As described above, the present solid laser has large output but has the very short output time. Therefore, it is difficult that the formation of the crystal grain, of which the grain size is equal to or larger than that of the crystal grain formed by laser crystallization using the excimer laser, is realized by laser crystallization using the solid laser. Note that the output time indicates half-width in one pulse through this specification.

Here, crystallization of a semiconductor film is conducted using a YAG laser that is a typical solid laser. The YAG laser with flash lamp excitation is used. The laser beam of the YAG laser is modulated into second harmonic by a nonlinear optical element, and then, the second harmonic is processed to have a linear shape of 10 cm length or more in an optical system to thereby irradiate a silicon film. The grain size of the crystal grain formed by laser annealing using the YAG laser has been much smaller than that of the crystal grain formed by using the excimer laser. The state of the crystal grains formed using the YAG laser is shown in FIG. 6. When a TFT is manufactured using a crystalline semiconductor film having the above crystal grain, a large number of crystal grain boundaries exist in a channel forming region that has an important influence on the electrical characteristic of the TFT, which becomes a factor in reduction of the electrical characteristic. As described above, the fact that the present solid laser has large output but has a very short output time can be given as the reason that only a small crystal grain is formed by laser annealing using the solid laser. Further, as another reason, the fact is given that only the energy density lower than that suitable for crystallization is obtained in case of the linear shape of 10 cm length or more. Of course, as the countermeasure against this case, it is considered that laser annealing is performed using the laser beam condensed to the energy density suitable for crystallization. However, it is desirable that the laser annealing with the YAG laser is conducted with at least approximately the same process efficiency as the laser annealing with the excimer laser. In order to achieve this, it is preferable that a laser beam is processed into the linear beam of which the length is approximately equal to or larger than that of the laser beam of the excimer laser.

Further, in the SLS method, a precise control of micron order is needed for the technique of relative positioning between a mask and a substrate, and thus, the complicated laser irradiation apparatus is required in comparison with normal one. Further, there is a problem on throughput in the case where the SLS method is used in manufacturing a TFT applied to a liquid crystal display having a large surface area.

Moreover, in the method announced by Matsumura et al., a phase shift mask for making an energy gradient of a laser beam needs to be used. Therefore, the precise control of micron order is needed for the technique of relative positioning between the phase shift mask and an embedded insulating layer, and also, the complicated laser irradiation apparatus is required in comparison with normal one.

SUMMARY OF THE INVENTION

The present invention has been made in view of the above, and an object of the present invention is therefore to provide a laser irradiation apparatus with running cost lower than that of a conventional one and a laser annealing method in which the laser irradiation apparatus is used, for forming a crystal grain of grain size equal to or larger than that of a conventional crystal grain. Further, another object of the present invention is to provide a laser irradiation method for manufacturing a crystalline semiconductor film in which a position and a size of a crystal grain are controlled. Moreover, the crystalline semiconductor film manufactured by using the laser irradiation method is used for a channel forming region of a TFT, whereby the TFT that enables high speed operation is realized. Furthermore, still another object of the present invention is to provide a technique of applying the TFT to various semiconductor devices such as a transmission type liquid crystal display device and a display device using an electroluminescence material.

FIGS. 1A to 4B show reflectivity and transmissivity to a wavelength. FIGS. 1A and 1B show reflectivity and transmissivity to a wavelength in an amorphous silicon film (55 nm thickness) formed on a 1737 glass substrate. FIGS. 2A and 2B show reflectivity and transmissivity to a wavelength in a crystalline silicon film (55 nm thickness) formed on the 1737 glass substrate. FIGS. 3A and 3B show reflectivity and transmissivity to a wavelength in the 1737 glass substrate. FIGS. 4A and 4B show reflectivity and transmissivity to a wavelength in a synthetic quartz glass substrate.

In an XeCl excimer laser (308 nm wavelength) generally used in laser annealing, the reflectivity to the amorphous silicon film is 54%, and the transmissivity is 0%. Further, the reflectivity to the crystalline silicon film is 52%, and the transmissivity is 0%. On the other hand, in second harmonic of a YAG laser (532 nm wavelength), the reflectivity to the amorphous silicon film is 26%, and the transmissivity is 38%. Further, the reflectivity to the crystalline silicon film is 30%, and the transmissivity is 45%.

The 1737 glass substrate is used in FIGS. 1A to 2B. In FIG. 3B, the transmissivity of the 1737 glass substrate increases in proportion to the wavelength in a range of 200 to 380 nm, and is 90% or more in the wavelength longer than that with a length of 380 nm. The transmissivity of the 1737 glass substrate at a wavelength of 308 nm is lower than that at a wavelength of 380 nm or more, but the transmissivity at the wavelength of 308 nm with respect to the amorphous silicon film and the crystalline silicon film is 0%. Therefore, it may be considered that there is almost no influence of the 1737 glass substrate. Further, since the transmissivity of the 1737 glass substrate at a wavelength of 532 nm is 90% or more, it may be considered that there is almost no influence of the 1737 glass substrate.

Further, the case where a semiconductor film is formed on the synthetic quartz glass substrate is taken into consideration. In FIG. 4B, the transmissivity of the synthetic quartz glass substrate is always 90% or more to a wavelength in a range of 200 to 800 nm. Therefore, the influence of the synthetic quartz glass substrate does not need to be considered more in comparison with the 1737 glass substrate.

From the above, it is found that the second harmonic of the YAG laser has lower reflectivity and high transmissivity to the amorphous semiconductor film and the crystalline semiconductor film (both the films have a thickness of 55 nm) in comparison with the XeCl excimer laser. That is, it is found that when laser annealing is conducted to the amorphous silicon film or the crystalline semiconductor film, the laser beam of the XeCl excimer laser does not transmit through these semiconductor films but the second harmonic of the YAG laser transmits through the semiconductor films. Further, the second harmonic of the YAG laser shows high transmissivity to the 1737 glass substrate and the synthetic quartz glass substrate.

According to the present invention, in order to realize a reduction in cost of laser annealing and a large grain size of a crystal grain of a crystalline semiconductor film manufactured by a crystallization method by the laser annealing, a laser irradiation method is characterized in that: a substrate on which a reflecting film is formed or a reflecting plate formed from a material with high reflectivity (hereinafter these are referred to as reflecting member) is provided on a rear surface side of a substrate on which a semiconductor film is formed (hereinafter referred to as semiconductor film substrate); a front surface side (defined as a surface on which a film is formed in this specification) of the semiconductor film substrate is irradiated with a laser beam; the laser beam that has penetrated the semiconductor film substrate is reflected by the reflecting member; and the rear surface side (defined as an opposing surface to the surface on which a film is formed in this specification) of the semiconductor film substrate is irradiated with the laser beam again. With this irradiation method, an effective energy density can be enhanced with respect to the semiconductor film. Further, since the laser beam output time with respect to the semiconductor film can be extended, the laser irradiation method is characterized in that a cooling process of the semiconductor film can be made gentle and the crystal grain of large grain size can be formed. Moreover, if the semiconductor film is formed after the formation of a base insulating film on the substrate, the heat obtained by laser beam irradiation is gradually released, thereby being capable of making the cooling process of the semiconductor film more gentle. Of course, the base insulating film is a film such as a silicon oxide film or a silicon oxynitride film which has high transmissivity to a wavelength of the laser beam used in crystallization. In addition, laser annealing can be conducted with lowered output of a laser oscillator in comparison with a prior art, and thus, the life of a rod can be extended.

Further, in order to form the position-controlled crystal grain of large grain size, one of effective means is that a temperature distribution is provided in a semiconductor film. Specifically, there is a method of making the distribution of irradiation intensity of a laser beam to a semiconductor film.

According to the present invention, in order to realize a position control and large grain size of a crystal grain of a crystalline semiconductor film manufactured by a crystallization method by laser annealing, the laser irradiation method is characterized in that: a substrate formed with a reflecting layer having a desired shape (reflecting member) is provided on the lower side of a semiconductor film substrate; a laser beam is irradiated from the upper side of the semiconductor film substrate; the laser beam that has penetrated the semiconductor film substrate is reflected at the reflecting layer having the desired shape on the reflecting member; the semiconductor film substrate is again irradiated from the lower side; and thus, a cooling process of the semiconductor film is partially made gentle.

When the reflecting layer of the reflecting member has the desired shape, only predetermined regions in the semiconductor film can be irradiated with reflection light, whereby a temperature distribution can be made in the semiconductor film. Thus, the position control of the crystal grain can be realized. Further, growth distance of the crystal grain is in proportion to the product of a growth time by a growth rate. Therefore, a cooling rate becomes gentle and the growth time becomes longer, thereby being capable of making the grain size larger. That is, it is desirable that the growth distance of the crystal grain is considered for the shape of the reflecting layer.

The laser irradiation method according to the present invention is characterized in that a heat-resistance material is used as a material for forming the reflecting member and a material with high reflectivity to the laser beam is used. As shown in FIG. 5, an element selected from the group consisting of tungsten (W), tantalum (Ta), titanium (Ti) and chromium (Cr), or a compound or alloy containing the above element as its constituent may be used for forming the reflecting member. A substrate on which a reflecting film is formed may be used as the reflecting member, or a reflecting member formed from a material with high reflectivity may be used.

In the reflecting member, a surface on which a laser beam is reflected may be a flat surface or a curved surface. The laser beam is condensed on the surface of the semiconductor film formed on the substrate or in the vicinity thereof. Further, a part of the laser beam transmits through the substrate and the semiconductor film, and is reflected by the reflecting member to thereby irradiate the rear surface side of the semiconductor film. At this time, there may be a case where the laser beam reflected by the reflecting member expands in comparison with the laser beam incident from the front surface side of the semiconductor film if the shape of the surface of the reflecting member on which the laser beam is reflected is a flat surface. Therefore, if the shape of the surface of the reflecting member on which the laser beam is reflected is a curved surface, the laser beam which is reflected by the reflecting member and is condensed can be irradiated to the rear surface side of the semiconductor film, and the effective energy density to the semiconductor film can further be enhanced. The curvature of the curved surface differs depending on the state of the laser beam, the distance between the substrate and the reflecting member, and the like, and thus, an operator may appropriately determine the curvature.

Further, when the laser beam is irradiated to the substrate on which the semiconductor film is formed from the front surface side of the substrate, the substrate and the reflecting member may move relatively to the laser beam, or only the substrate may move relatively to the laser beam and the reflecting member.

Further, the laser beam used in the present invention is not limited to the second harmonic of the YAG laser. It is an essential condition that the laser beam transmits through a semiconductor film and a substrate on which the semiconductor film is formed. Then, in accordance with FIG. 2B and FIG. 3B, it is assumed that the wavelength of the laser beam is set to 350 nm or more (preferably 400 nm or more). For example, a solid laser, a gas laser and a metal laser of continuous oscillation type or pulse oscillation type may be used. As the solid laser, there are given a $YVO_4$ laser, a YLF laser, a $YAlO_3$ laser, a glass laser, a ruby laser, an alexandrite laser, a Ti:sapphire laser and the like of continuous oscillation type or pulse oscillation type. As the gas laser, there are given an XeF excimer laser, an Ar laser, a Kr laser, a $CO_2$ laser and the like of continuous oscillation type or pulse oscillation type. As the metal laser, there are given a helium cadmium laser, a copper-vapor laser, a gold-vapor laser and the like of continuous oscillation type or pulse oscillation type. The laser beam emitted from the above lasers may be converted into harmonic to be used by using a nonlinear optical element.

Further, an amorphous semiconductor film or a crystalline semiconductor film may be given as the semiconductor film. In addition to an amorphous silicon film, a compound semiconductor film having an amorphous structure such as an amorphous silicon germanium film may also be applied.

Furthermore, a substrate having a light transmitting property to laser light such as a glass substrate, a quartz substrate, a plastic substrate or a flexible substrate may be used as the substrate. As the glass substrate, a glass substrate formed of barium borosilicate glass or alumino borosilicate glass may be given. Further, a flexible substrate indicates a film-shape substrate made from PET, PES, PEN, acrylic or the like. A semiconductor device is manufactured by using the flexible substrate, whereby the reduction in weight of the device is expected. It is desirable that a barrier layer such as an aluminum film (AlON, AlN, AlO or the like), a carbon film (DLC (diamond-like carbon) or the like) or SiN is formed with a single layer or multiple layers on the front surface or both front and rear surfaces of the flexible substrate since the durability and the like are improved.

As described above, according to the present invention, the crystallization of the semiconductor film is conducted by utilizing the reflecting member, whereby the crystalline semiconductor film having the crystal grains of large grain size can be formed. Further, if the reflecting member is manufactured once, it can be used over and over.

The performance of the semiconductor device can be remarkably improved by obtaining the crystalline semiconductor film having the crystal grains of large grain size. For example, regarding a TFT given as an example, the number of crystal grain boundaries that may be contained in a channel forming region can be reduced with enlarged grain size of a crystal grain. That is, the TFT having the channel forming region with one crystal grain boundary, preferably zero crystal grain boundary can be manufactured. Further, since an individual crystal grain has the crystallinity such that it can be regarded substantially as a single crystal, the high mobility (field effect mobility) equal to or more than that of a transistor using a single crystal semiconductor can be obtained.

Furthermore, since the number of crossings across the crystal grain boundary by a carrier can be remarkably reduced, it is possible to reduce variations of an on current value (a value of a drain current flowing in an on state of a TFT), an off current value (a value of a drain current flowing in an off state of a TFT), a threshold voltage, an S value and an electric field mobility.

BRIEF DESCRIPTION OF THE DRAWINGS

In the accompanying drawings:

FIGS. 11A to 11C are cross sectional views of an example of a manufacturing process of a pixel TFT and TFTs of a driver circuit;

FIGS. 12A to 12C are cross sectional views of an example of the manufacturing process of the pixel TFT and the TFTs of the driver circuit;

FIGS. 16A and 16B are a top view of the light emitting device and a cross sectional structural view of the driver circuit and the pixel portion of the light emitting device, respectively;

FIGS. 22A and 22B are diagrams of an example of a method of manufacturing a reflecting member disclosed in the present invention;

FIG. 23 is a diagram of an example of a semiconductor film substrate disclosed in the present invention;

FIG. 28 is diagram of an example of the optical system for forming linear laser beam.

DETAILED DESCRIPTION OF THE PREFERRED EMBODIMENTS

Embodiment Mode 1

An embodiment mode of the present invention is described below with reference to FIGS. 7A to 8B.

Figure 7A:
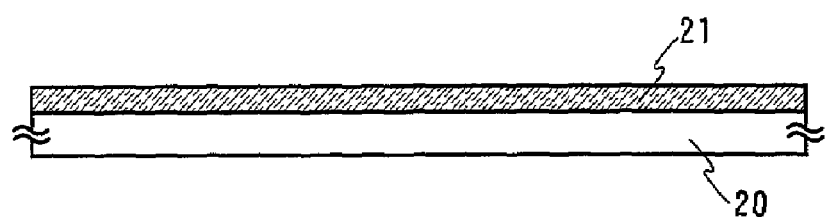
FIGS. 7A and 7B are diagrams showing examples of semiconductor film substrates disclosed in the present invention.

First, an example of a method of manufacturing a reflecting member is described with reference to FIG. 7A. In FIG. 7A, as a substrate 20, a glass substrate or a synthetic quartz glass substrate is used. Further, a plastic substrate having heat resistance that withstands a process temperature may be used.

Then, a reflecting film 21 is deposited on the substrate 20 by a known means (a sputtering method, an LPCVD method, a plasma CVD method or the like). As the reflecting film 21, a film with high reflectivity to a wavelength of a laser beam used in crystallization and also with heat resistance that withstands the process temperature is desirable. The reflectivity most suitable for crystallization depends on the state of a semiconductor film, the wavelength of the laser beam and the like.

As described above, the reflecting member is manufactured. Of course, instead of manufacturing the reflecting member by forming the reflecting film on the substrate, a reflecting plate using a material with high reflectivity may be used as the reflecting member. If the above reflecting member is manufactured once, it can be used over and over in conducting laser irradiation.

Figure 7B:
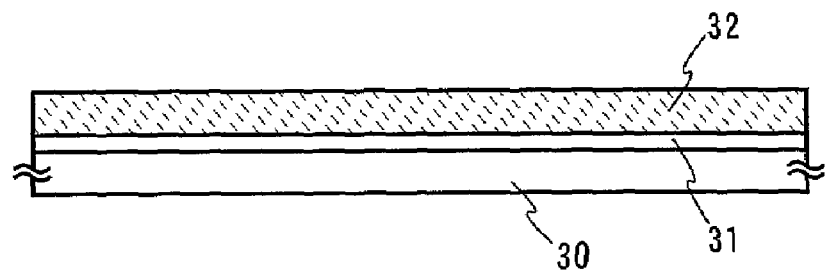

Next, a method of manufacturing a semiconductor film substrate is described with reference to FIG. 7B. In FIG. 7B, as a substrate 30, a substrate having a light transmitting property is desirable, and a glass substrate or a synthetic quartz glass substrate is desirably used. Then, a base insulating film 31 and a semiconductor film 32 are formed on the substrate 30 by a known means (a sputtering method, an LPCVD method, a plasma CVD method or the like). Of course, the base insulating film 31 may not be manufactured. However, as the base insulating film 31, a film with high transmissivity such as a silicon oxide film or a silicon oxynitride film is used to a wavelength of a laser beam used in crystallization, whereby a heat retaining effect by laser beam irradiation is obtained. This is effective in making a cooling rate of the semiconductor film gentle.

As described above, the semiconductor film substrate is manufactured.

The semiconductor film substrate and the reflecting member are prepared by the above-described manufacturing methods, and crystallization of the semiconductor film is conducted. In the crystallization process, it is preferable that hydrogen contained in the semiconductor film is let out in advance. It is preferable that a heating process is performed at 400 to 500° C. for approximately one hour in order that the amount of the contained hydrogen is made to 5% or less of the total number of atoms contained in the semiconductor film and then, the crystallization is conducted since the roughness of the film surface can be prevented.

Figure 8A:
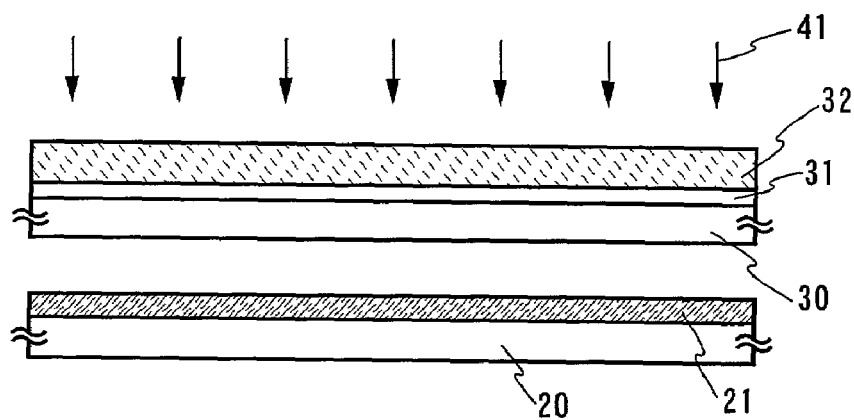
FIGS. 8A and 8B are diagrams showing an example of a method of crystallizing a semiconductor film by laser annealing disclosed in the present invention.
Figure 8B:
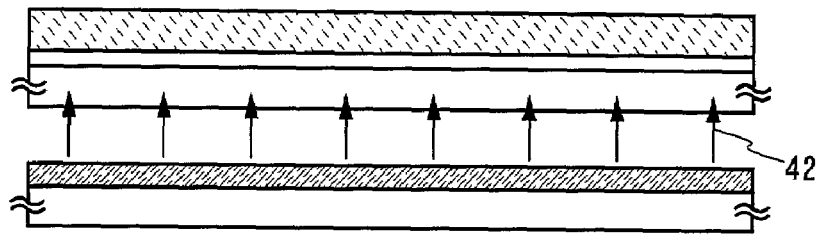

Then, as shown in FIG. 8A, the reflecting member is provided on a rear surface side of the semiconductor film substrate, and a front surface side of the semiconductor film substrate is irradiated with a laser beam 41. At this time, the semiconductor film substrate and the reflecting member may be arranged so as to be in contact with each other. Further, a laser beam with a wavelength of 350 nm or more (preferably 400 nm or more) is used as the laser beam 41. For example, a YAG laser, a glass laser, an Ar laser, a YLF laser, a $YVO_4$ laser or the like may be used. When the above laser is used, it is preferable that a method of condensing a laser beam emitted from a laser oscillator into a linear shape in an optical system and irradiating a semiconductor film with the linear laser beam is used. Although the crystallization condition is appropriately selected by an operator, in case of using second harmonic of the YAG laser, it is preferable that the pulse oscillation frequency is set to 1 to 300 Hz and the laser energy density is set to 300 to 1000 $mJ/cm^2$ (typically, 350 to 800 $mJ/cm^2$). Then, the laser beam condensed into a linear shape with a width of 100 to 1000 μm, for example, 400 μm is irradiated over the entire surface of the substrate. At this time, the linear laser beam may be irradiated in an overlapping manner. For example, irradiation may be conducted with an overlap ratio of 50 to 98%.

The laser beam 42 which penetrates the semiconductor film substrate and is reflected by the reflecting film irradiates the semiconductor film 32 from the rear surface side again. An effective energy density to the semiconductor film 32 is raised by the irradiation of the laser beams 41 and 42. Further, an effective output time of the laser beam to the semiconductor film is extended, and the heat retaining effect of the base insulating film is obtained, whereby the cooling process from the melted state of the semiconductor film can be made gentle. As a result, a crystal grain of large grain size can be formed in the semiconductor film.

Embodiment Mode 2

Another structure of the present invention, which is different from that of Embodiment Mode 1, is described below with reference to FIGS. 22A to 24E.

First, a method of manufacturing a reflecting member is described with reference to FIGS. 22A and 22B. In FIGS. 22A and 22B, as a substrate 220, a glass substrate or a synthetic quartz glass substrate is used. Further, a plastic substrate having heat resistance that withstands a process temperature may be used.

Then, a reflecting film 221 is deposited on the substrate 220 by a known means (a sputtering method, an LPCVD method, a plasma CVD method or the like). As the reflecting film 221, a film with high reflectivity to a wavelength of a laser beam used in crystallization and also with heat resistance that withstands the process temperature is desirable. The reflectivity most suitable for crystallization depends on the state of a semiconductor film, the wavelength of the laser beam and the like.

Thereafter, the reflecting film is patterned into a desired shape to form a plurality of reflecting layers 222. In FIG. 22B, there are shown a cross sectional view and a top view of a substrate on which the reflecting layers are formed. It is preferable that the width of each of the reflecting layers 222 and the interval between the reflecting layers 222 are determined taking the size of a crystal grain to be formed into consideration. For example, as shown in FIG. 22B, there is a method of periodically forming reflecting layers whose upper surfaces each have a stripe shape. At this time, it is desirable that the reflecting layers each have a width of 1 to 10 μm and that the reflecting layers are formed at 0.1 to 10 μm intervals.

As described above, the reflecting member is manufactured. If this reflecting member is manufactured once, it can be used over and over in conducting laser irradiation.

Next, a method of manufacturing a semiconductor film substrate is described with reference to FIG. 23. In FIG. 23, as a substrate 230, a substrate having a light transmitting property is desirable, and a glass substrate or a synthetic quartz glass substrate is desirably used. Then, a base insulating film 231 and a semiconductor film 232 are formed on the substrate 230 by a known means (a sputtering method, an LPCVD method, a plasma CVD method or the like). The base insulating film 231 is a film with high transmissivity such as a silicon oxide film or a silicon oxynitride film with respect to a wavelength of a laser beam used in crystallization.

As described above, the semiconductor film substrate is manufactured.

The semiconductor film substrate and the reflecting member are prepared by the above-described manufacturing methods, and crystallization of the semiconductor film is conducted. In the crystallization process, it is preferable that hydrogen contained in the semiconductor film is let out in advance. It is preferable that a heating process is performed at 400 to 500° C. for approximately one hour in order that the amount of the contained hydrogen is made to 5% or less of the total number of atoms contained in the semiconductor film and then, the crystallization is conducted since the roughness of the film surface can be prevented.

Figure 24A:
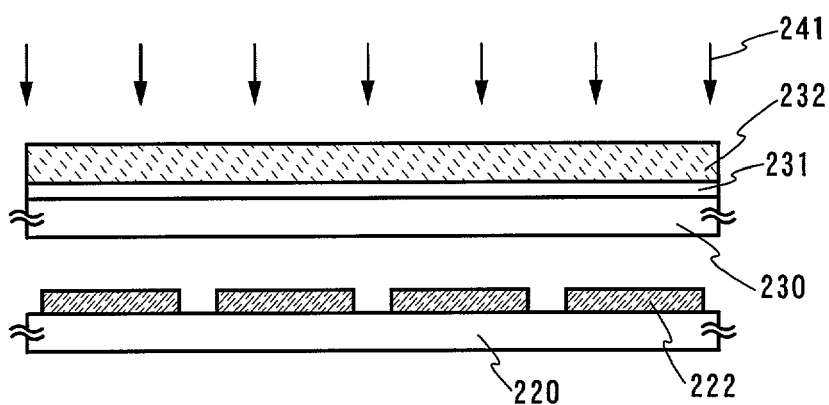
FIGS. 24A to 24E are diagrams of an example of a method of crystallizing a semiconductor film by laser annealing disclosed in the present invention.
Figure 24B:
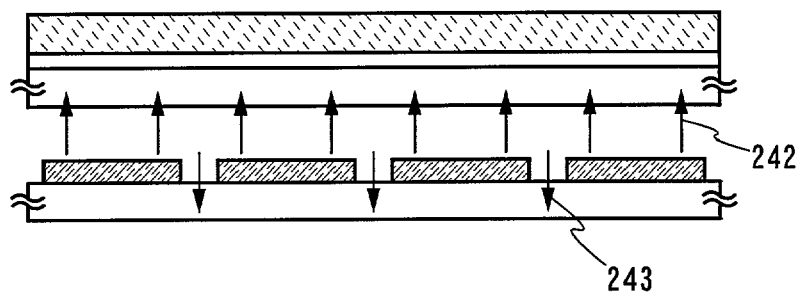

Then, as shown in FIG. 24A, the reflecting member is provided on the lower side of the semiconductor film substrate, and a laser beam 241 is irradiated from the upper side of the semiconductor film substrate. At this time, the semiconductor film substrate and the reflecting member may be arranged so as to be in contact with each other. Further, a laser beam with a wavelength of 350 nm or more (preferably 400 nm or more) is used as the laser beam 241. For example, a YAG laser, a glass laser, an Ar laser, a YLF laser, a $YVO_4$ laser or the like may be used. When the above laser is used, it is preferable that a method of condensing a laser beam emitted from a laser oscillator into a linear shape in an optical system and irradiating a semiconductor film with the linear laser beam is used. Although the crystallization condition is appropriately selected by an operator, in case of using second harmonic of the YAG laser, it is preferable that the pulse oscillation frequency is set to 1 to 300 Hz and the laser energy density is set to 300 to 1000 $mJ/cm^2$ (typically, 350 to 800 $mJ/cm^2$). Then, the laser beam condensed into a linear shape with a width of 100 to 1000 μm, for example, 400 μm is irradiated over the entire surface of the substrate. At this time, the linear laser beam may be irradiated in an overlapping manner. For example, irradiation may be conducted with an overlap ratio of 50 to 98%.

The laser beam that has penetrated the semiconductor film substrate becomes a laser beam 242 reflected by a reflecting layer and a laser beam 243 not reflected by the reflecting layer. The reflected laser beam 242 partially irradiates the semiconductor film 232 again.

Figure 24C:
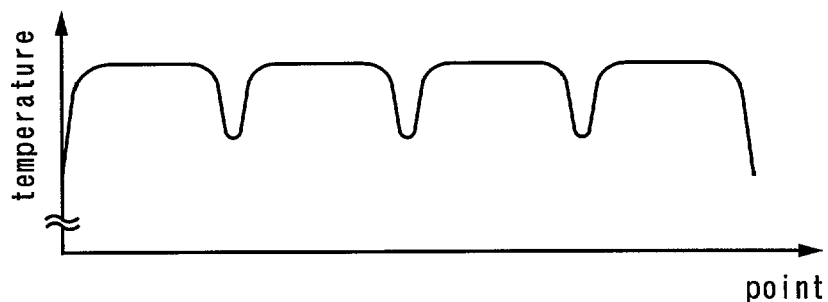
Figure 24D:
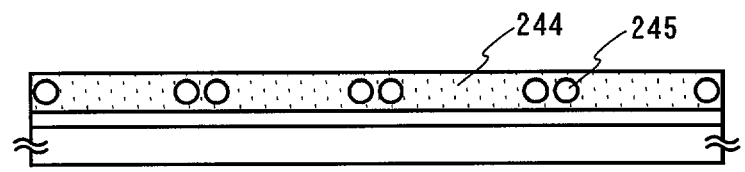

The semiconductor film 232 becomes in a completely melted state by irradiation of the laser beams 241 and 242. In the semiconductor film 232, a region irradiated with the laser beam 242 reflected by the reflecting layer and a region not irradiated with the laser beam 242 reflected by the reflecting layer exist. Because of the above-described distribution of the irradiation intensity of the laser beam, a temperature distribution shown in FIG. 24C is made in the semiconductor film. In the semiconductor film, the region at a low temperature is cooled faster than the region at a high temperature, and crystal nuclei 245 are generated. At this time, the region at a high temperature is still in the completely melted state. It takes time in a degree until the crystal nuclei are generated in a completely melted region. Therefore, until the crystal nuclei are generated in the completely melted region, a solid-liquid interface, which is the tip of the crystal growth, moves in a lateral direction, and the crystal nuclei 245 each grow into a crystal grain of large grain size. Thus, the crystal grains of large grain size are formed in the semiconductor film above the reflecting layers. That is, if the reflecting layers are formed into a desired shape, the crystal grains of large grain size can be formed at arbitrary positions in the semiconductor film.

Figure 24E:
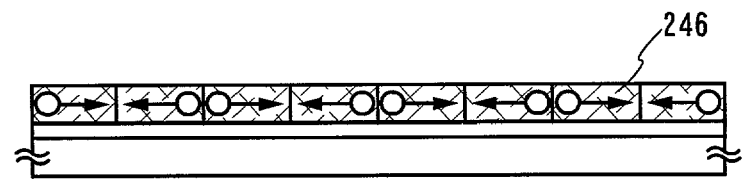

Further, in the case where the semiconductor film 232 is not completely melted by the irradiation of the laser beams 241 and 242 and solid phase semiconductor regions partially remain, the crystal growth begins at the solid phase semiconductor regions. In this case as well, the temperature distribution shown in FIG. 24C is made in the semiconductor film. Thus, as shown in FIG. 24E, the crystal grows in the lateral direction, and the position-controlled crystal grains of large grain size can be formed.

As described above, a crystalline semiconductor film 246, which is position-controlled and also has crystal grains of large grain size, can be formed.

A description is made on the present invention with the above structure in more detail with embodiments described below.

Embodiment 1

An embodiment of the present invention is described below with reference to FIGS. 7A to 8B.

First, a method of manufacturing a reflecting member is described with reference to FIG. 7A. In FIG. 7A, as a substrate 20, a glass substrate or a synthetic quartz glass substrate is used. Further, a plastic substrate having heat resistance that withstands a process temperature may be used. In this embodiment, 1737 substrate glass of Corning Corp. is used.

Then, a reflecting film 21 is deposited on the substrate 20 by a known means (a sputtering method, an LPCVD method, a plasma CVD method or the like). As the reflecting film 21, a film with high reflectivity to a wavelength of a laser beam used in crystallization and also with heat resistance that withstands the process temperature is desirable. The reflectivity most suitable for crystallization depends on the state of a semiconductor film, the wavelength of the laser beam and the like. In this embodiment, tantalum (Ta) is formed by the sputtering method.

As described above, the reflecting member is manufactured.

Next, a method of manufacturing a semiconductor film substrate is described with reference to FIG. 7B. As a substrate 30, a substrate having a light transmitting property is desirable, and a glass substrate or a synthetic quartz glass substrate is desirably used. The 1737 substrate glass of Corning Corp. is used in this embodiment. Then, a base insulating film 31 and a semiconductor film 32 are formed on the substrate 30 by a known means (a sputtering method, an LPCVD method, a plasma CVD method or the like). The base insulating film 31 is a film with high transmissivity such as a silicon oxide film or a silicon oxynitride film with respect to a wavelength of a laser beam used in crystallization. In this embodiment, with the plasma CVD method, the silicon oxynitride film (composition ratio: Si=32%, O=27%, N=24% and H=17%) with a thickness of 50 nm and the silicon oxynitride film (composition ratio: Si=32%, O=59%, N=7% and H=2%) with a thickness of 50 nm are formed. Then, an amorphous silicon film with a thickness of 54 nm is formed in succession.

As described above, the semiconductor film substrate is manufactured.

The semiconductor film substrate and the reflecting member are prepared by the above-described manufacturing methods, and crystallization of the semiconductor film is conducted. In the crystallization process, it is preferable that hydrogen contained in the semiconductor film is let out in advance. It is preferable that a heating process is performed at 400 to 500° C. for approximately one hour in order that the amount of the contained hydrogen is made to 5% or less of the total number of atoms contained in the semiconductor film and then, the crystallization is conducted since the roughness of the film surface can be prevented. In this embodiment, the semiconductor film substrate is exposed in a nitrogen atmosphere at 500° C. for one hour.

Then, as shown in FIG. 8A, the reflecting member is provided on a rear surface side of the semiconductor film substrate, and a front surface side of the semiconductor film substrate is irradiated with a laser beam 41. At this time, the semiconductor film substrate and the reflecting member may be arranged so as to be in contact with each other. Further, a laser beam with a wavelength of 350 nm or more (preferably 400 nm or more) is used as the laser beam 41. For example, a YAG laser, a glass laser, an Ar laser, a YLF laser, a $YVO_4$ laser or the like may be used. When the above laser is used, it is preferable that a method of condensing a laser beam emitted from a laser oscillator into a linear shape in an optical system and irradiating a semiconductor film with the linear laser beam is used. Although the crystallization condition is appropriately selected by an operator, in case of using second harmonic of the YAG laser, it is preferable that the pulse oscillation frequency is set to 1 to 300 Hz and the laser energy density is set to 300 to 1000 mJ/cm$^2$ (typically, 350 to 800 mJ/cm$^2$). Then, the laser beam condensed into a linear shape with a width of 100 to 1000 μm, for example, 400 μm is irradiated over the entire surface of the substrate. At this time, irradiation may be conducted with an overlap ratio of 50 to 98%. In this embodiment, laser annealing is conducted using the second harmonic of the YAG laser.

The laser beam 42, which penetrates the semiconductor film substrate and is reflected by the reflecting film, irradiates the semiconductor film 32 from the rear surface side again. An effective energy density to the semiconductor film 32 is raised by the irradiation of the laser beams 41 and 42. Further, an effective output time of the laser beam to the semiconductor film is extended, and the heat retaining effect of the base insulating film is obtained, whereby the cooling process from the melted state of the semiconductor film can be made gentle. As a result, a crystal grain of large grain size can be formed in the semiconductor film.

Here, an optical system for forming a linear laser beam is described with reference to FIG. 28.

The structure shown in FIG. 28 is a general structure. Any said optical system is based on the structure shown in FIG. 28. The illustrated structure is not only a structure for converting a shape of laser beam on an irradiation surface into a linear shape but also a structure for homogenizing energy of the laser beam, simultaneously.

A laser beam emitted from a laser emitter 71 is split in the direction perpendicular to the travel direction of the laser beam by cylindrical array lenses 73. The perpendicular direction is herein referred to as a first direction. The longitudinal direction is bent toward the direction of light reflected by a mirror provided in an intermediate point in the optical system. In the illustrated structure, a laser beam is split into seven. These split laser beams are once bound together by a cylindrical array lens 74. In this way, the energy of the linear laser beam along its longer side is homogenized and the length of the linear laser beam is determined.

Next, with respect to a side view described in FIG. 28, a laser beam emitted from a laser emitter 71 is split in the direction perpendicular to the travel direction of the laser beam by cylindrical array lenses 72a and 72b. The perpendicular direction is herein referred to as a second direction. The second direction is bent toward the direction of light reflected by a mirror provided in an intermediate point in the optical system. In the illustrated structure, a laser beam is split into four. These split laser beams are once bound together by a cylindrical array lens 74. The beams are then reflected by a mirror 77, and unified back to a single laser beam on an irradiation surface 79 by a doublet cylindrical lens 78. The doublet cylindrical lens is a lens composed of two cylindrical lenses. In this way, the energy of the linear laser beam along its shorter side is homogenized and the length of the shorter side is determined.

In this way, the linear laser beam that has a homogenized distribution of the energy on the irradiation surface can be formed. Further, providing a reflecting member 80 on a rear side of the irradiation surface, the present invention can be carried on.

Figure 1A:
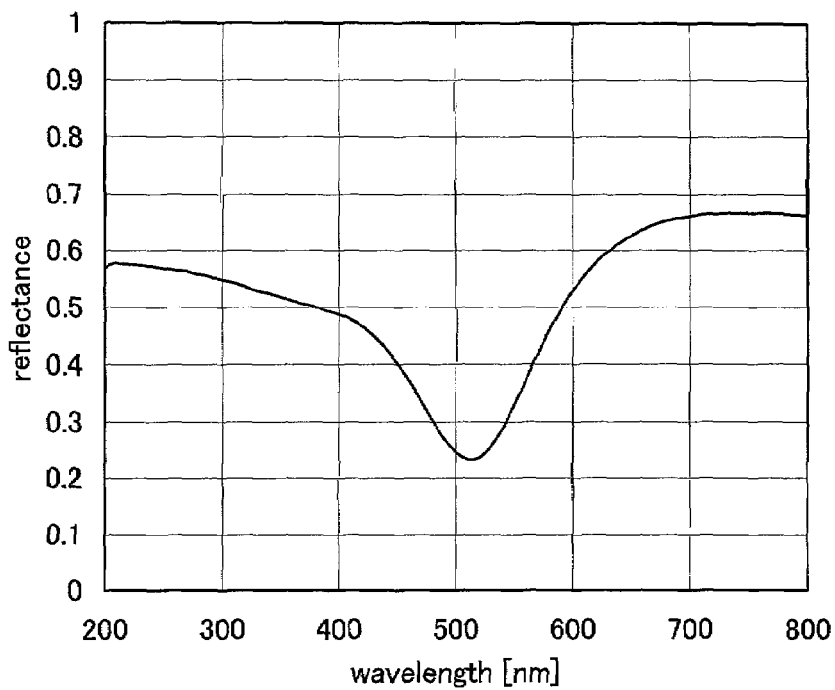
FIGS. 1A and 1B are a diagram showing reflectivity with respect to a wavelength in an amorphous silicon film of 55 nm thickness and a diagram showing transmissivity with respect to the wavelength in the amorphous silicon film of 55 nm thickness, respectively.
Figure 1B:
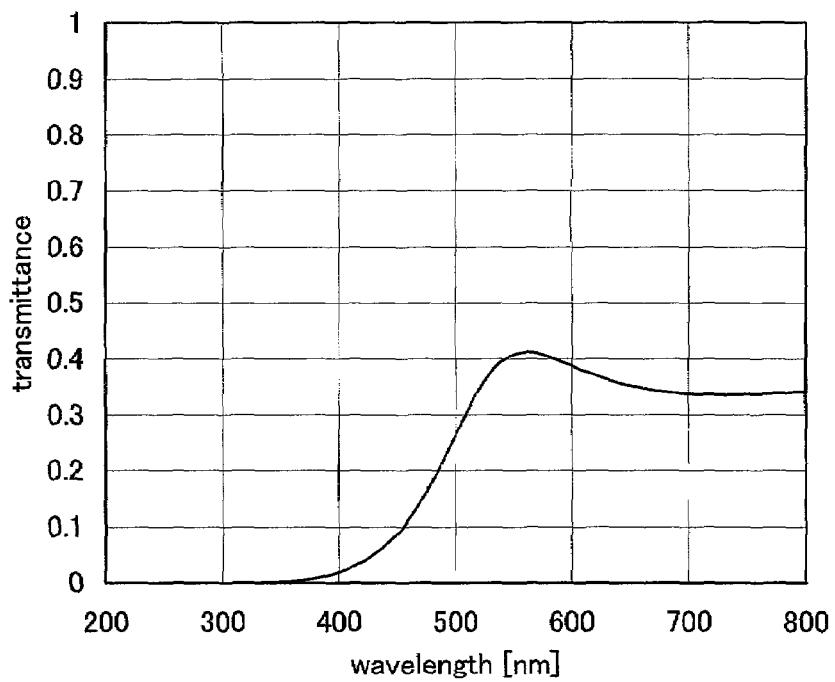
Figure 2A:
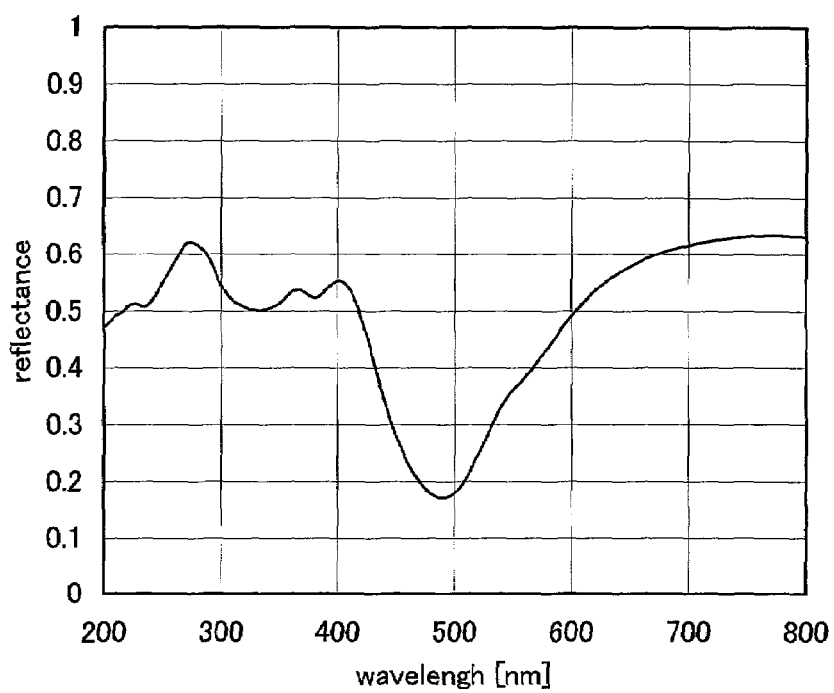
FIGS. 2A and 2B are a diagram showing reflectivity with respect to a wavelength in a crystalline silicon film of 55 nm thickness and a diagram showing transmissivity with respect to the wavelength in the crystalline silicon film of 55 nm thickness, respectively.
Figure 2B:
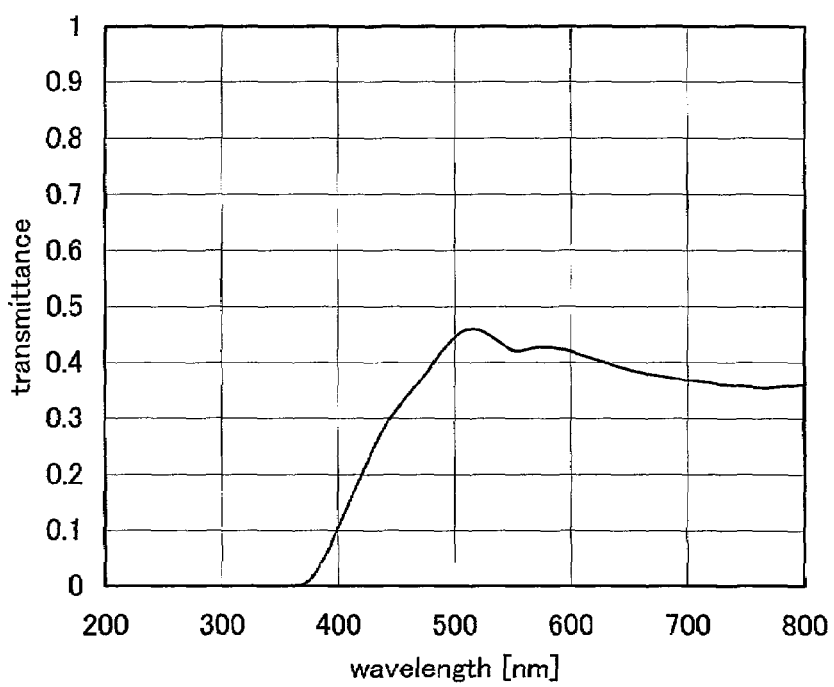
Figure 3A:
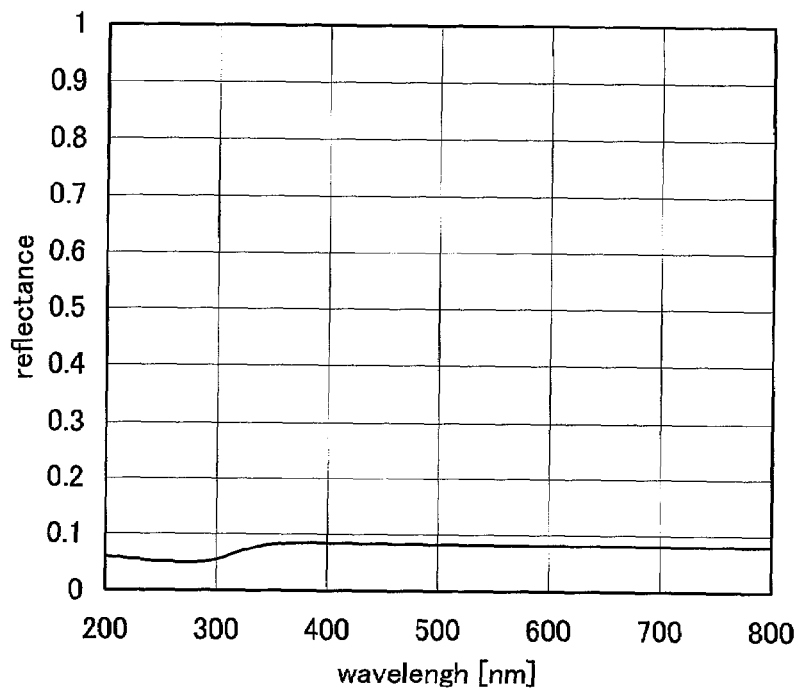
FIGS. 3A and 3B are a diagram showing reflectivity with respect to a wavelength in a 1737 glass substrate and a diagram showing transmissivity with respect to the wavelength in the 1737 glass substrate, respectively.
Figure 3B:
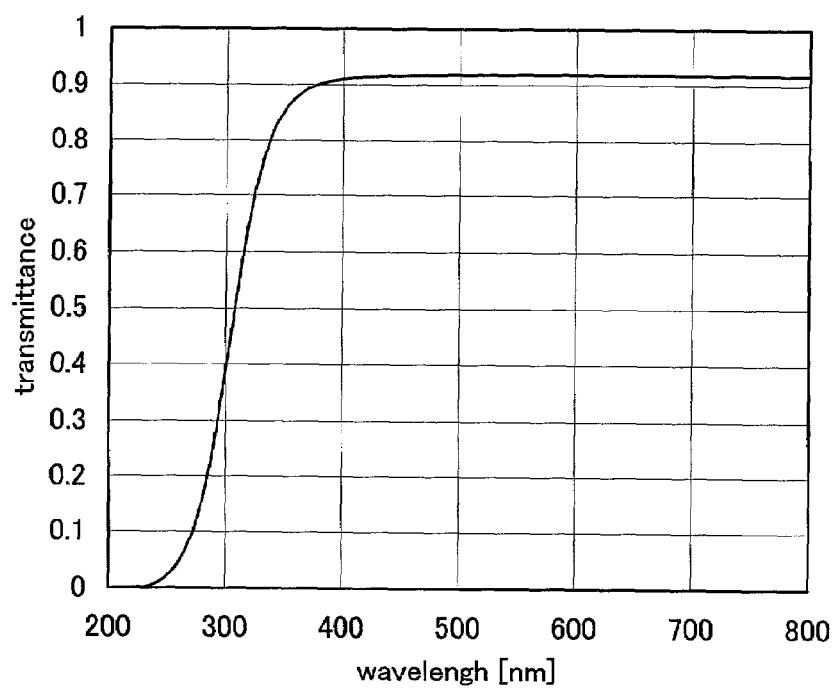
Figure 4A:
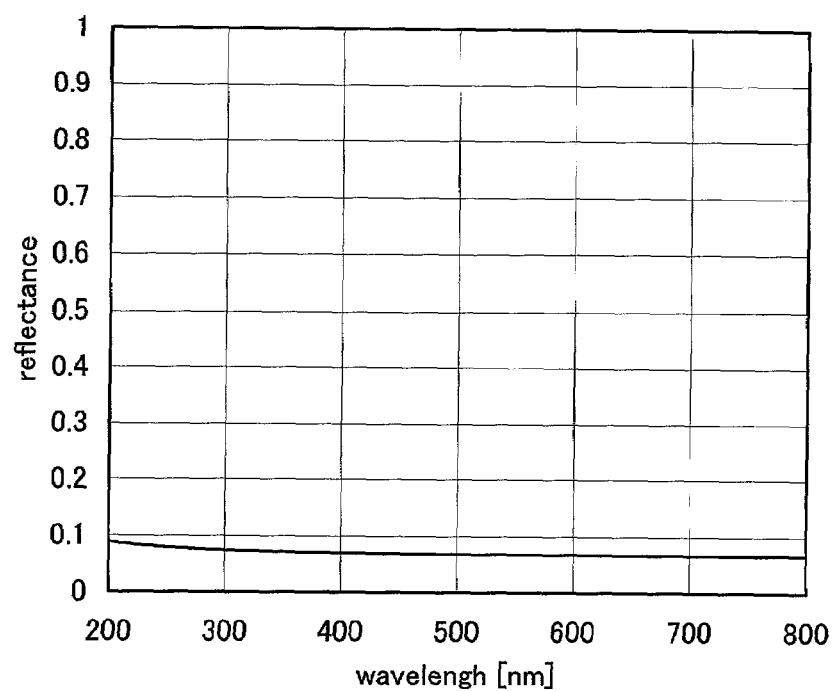
FIGS. 4A and 4B are a diagram showing reflectivity with respect to a wavelength in a synthetic quartz glass substrate and a diagram showing transmissivity with respect to the wavelength in the synthetic quartz glass substrate, respectively.
Figure 4B:
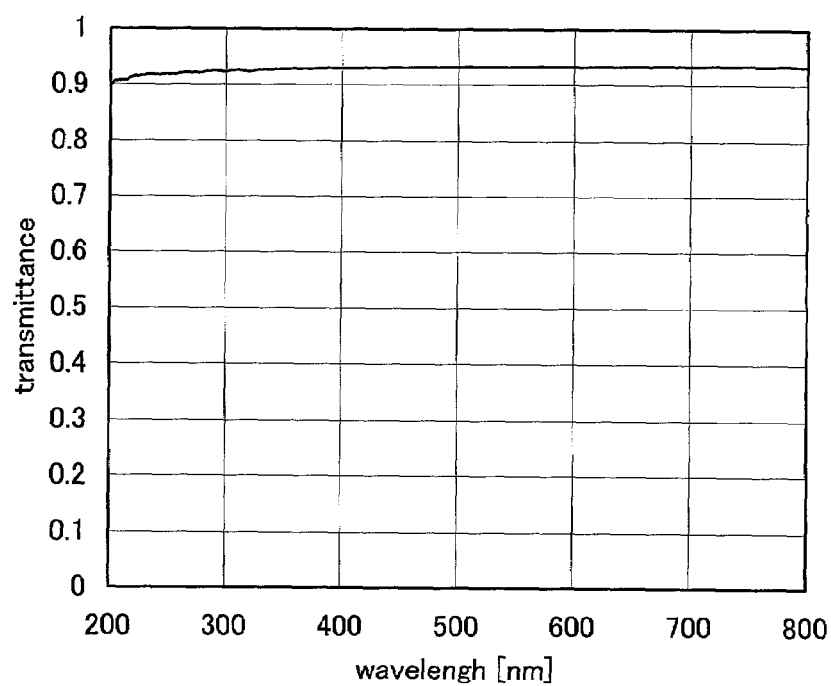
Figure 5:
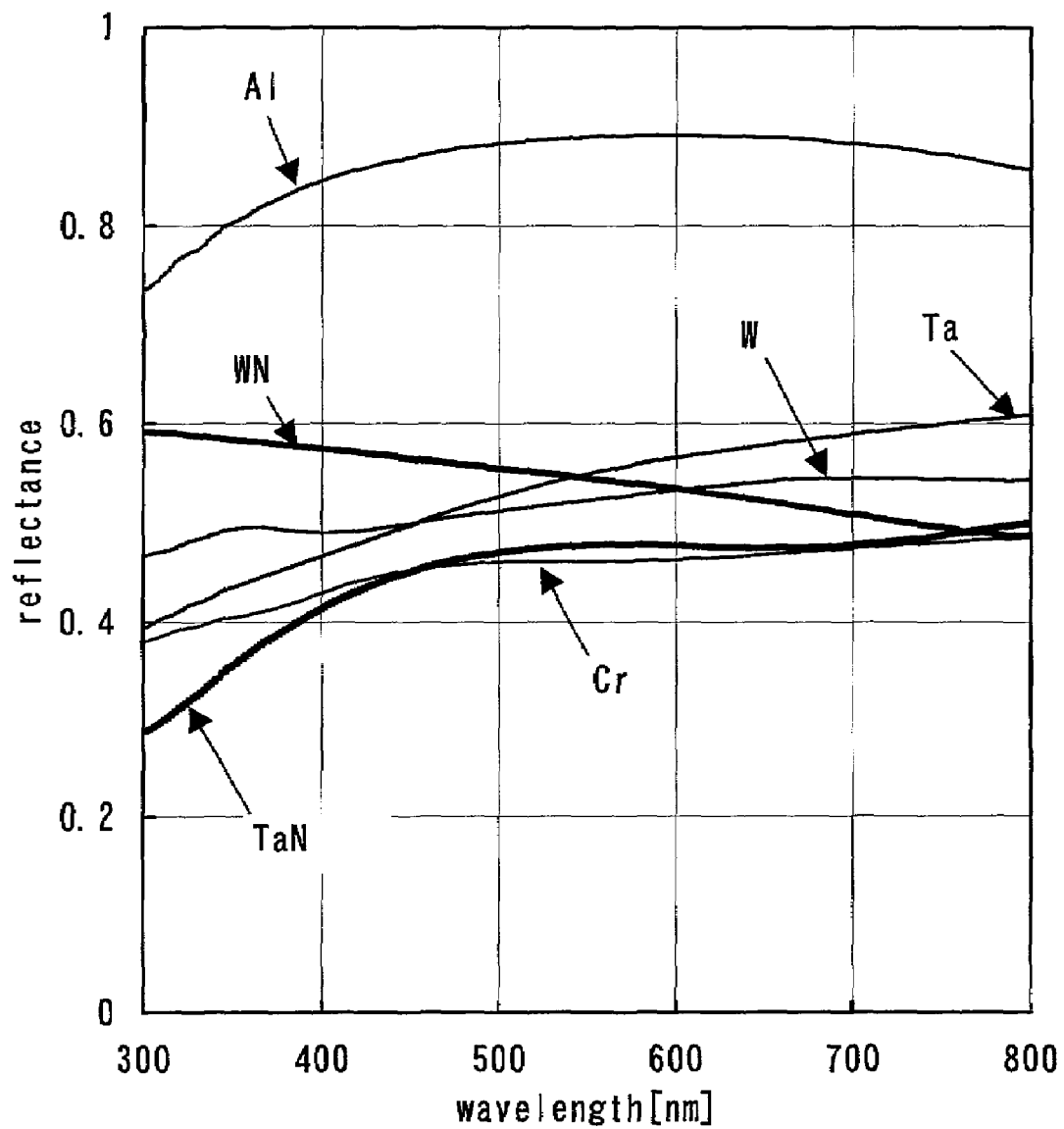
FIG. 5 is a diagram showing reflectivity with respect to a wavelength in an example of a reflecting material.
Figure 6:
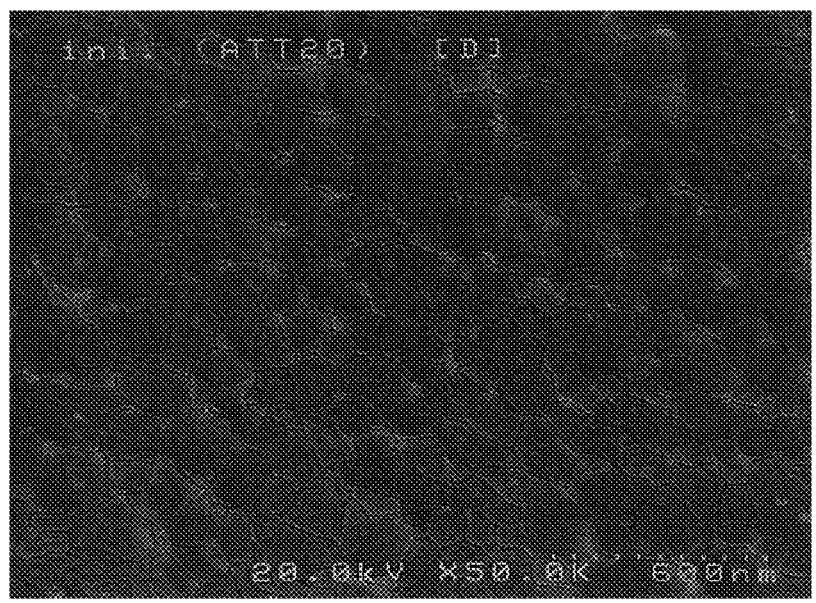
FIG. 6 shows an example of crystal grains in conducting laser annealing using a YAG laser.
Figure 9:
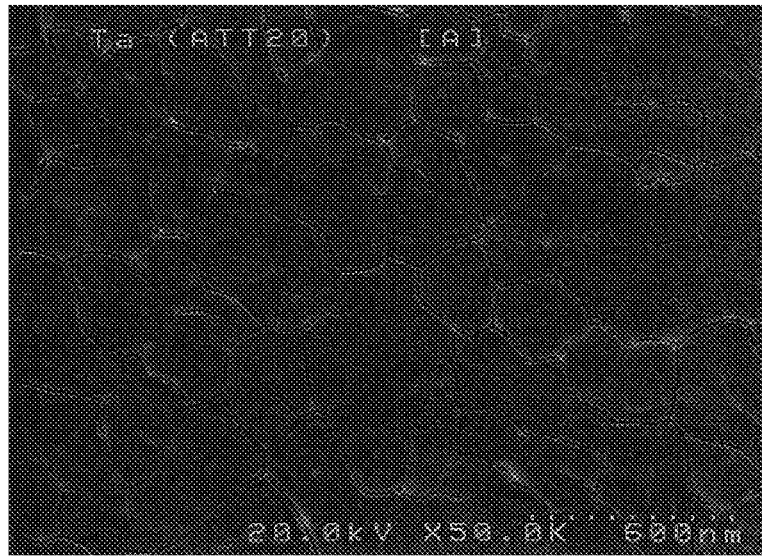
FIG. 9 is a diagram showing an example of crystal grains formed by a laser irradiation method disclosed in the present invention.

If a base material of the optical system mentioned above is, for instance, BK7 or synthetic quartz, a high transmittance can be obtained. Also, It is good to use a coating which gives each lens a transmittance of 99% or more regarding with a laser to be used. FIG. 9 shows a photograph in which crystal grains formed in accordance with this embodiment are observed with a magnifying power of fifty thousands by an SEM. It is apparent from FIG. 9 that the larger grain size of the crystal grain is realized in comparison with FIG. 6.

A TFT is manufactured by using a crystalline semiconductor film having such crystal grains, whereby the satisfactory electric characteristics are obtained.

Embodiment 2

In this embodiment, a description is made on the case where a reflecting member is formed using a reflecting film different from that used in Embodiment 1 and laser annealing of a semiconductor film is performed.

First, a method of manufacturing a reflecting member is described with reference to FIG. 7A. In FIG. 7A, as a substrate 20, a glass substrate or a synthetic quartz glass substrate is used. Further, a plastic substrate having heat resistance that withstands a process temperature may be used. In this embodiment, 1737 substrate glass of Corning Corp. is used.

Then, a reflecting film 21 is deposited on the substrate 20 by a known means (a sputtering method, an LPCVD method, a plasma CVD method or the like). As the reflecting film 21, a film with high reflectivity to a wavelength of a laser beam used in crystallization and also with heat resistance that withstands the process temperature is desirable. The reflectivity most suitable for crystallization depends on the state of a semiconductor film, the wavelength of the laser beam and the like. In this embodiment, Al—Si is formed by the sputtering method.

As described above, the reflecting member is manufactured.

A semiconductor film substrate is formed in the same manner as in Embodiment 1.

The semiconductor film substrate and the reflecting member are prepared by the above-described manufacturing methods, and crystallization of the semiconductor film is conducted. In the crystallization process, it is preferable that hydrogen contained in the semiconductor film is let out in advance. It is preferable that a heating process is performed at 400 to 500° C. for approximately one hour in order that the amount of the contained hydrogen is made to 5% or less of the total number of atoms contained in the semiconductor film and then the crystallization is conducted since the roughness of the film surface can be prevented. In this embodiment, the semiconductor film substrate is exposed in a nitrogen atmosphere at 500° C. for one hour.

Then, as shown in FIG. 8A, the reflecting member is provided on a rear surface side of the semiconductor film substrate, and a front surface side of the semiconductor film substrate is irradiated with a laser beam 41. At this time, the semiconductor film substrate and the reflecting member may be arranged so as to be in contact with each other. Further, a laser beam with a wavelength of 350 nm or more (preferably 400 nm or more) is used as the laser beam 41. For example, a YAG laser, a glass laser, an Ar laser, a YLF laser, a $YVO_4$ laser or the like may be used. When the above laser is used, it is preferable that a method of condensing a laser beam emitted from a laser oscillator into a linear shape in an optical system and irradiating a semiconductor film with the linear laser beam is used. Although the crystallization condition is appropriately selected by an operator, in case of using second harmonic of the YAG laser, it is preferable that the pulse oscillation frequency is set to 1 to 300 Hz and the laser energy density is set to 300 to 1000 mJ/cm$^2$ (typically, 350 to 800 mJ/cm$^2$). Then, the laser beam condensed into a linear shape with a width of 100 to 1000 μm, for example, 400 μm is irradiated over the entire surface of the substrate. At this time, irradiation may be conducted with an overlap ratio of 50 to 98%. In this embodiment, laser annealing is conducted using the second harmonic of the YAG laser.

Figure 10:
FIG. 10 is a diagram showing an example of crystal grains formed by a laser irradiation method disclosed in the present invention.

The laser beam 42, which penetrates the semiconductor film substrate and is reflected by the reflecting film, irradiates the semiconductor film 32 from the rear surface side again. An effective energy density to the semiconductor film 32 is raised by the irradiation of the laser beams 41 and 42. Further, an effective output time of the laser beam to the semiconductor film is extended, and the heat retaining effect of the base insulating film is obtained, whereby the cooling process from the melted state of the semiconductor film can be made gentle. As a result, a crystal grain of large grain size can be formed in the semiconductor film. FIG. 10 shows a photograph in which a crystal grain formed in accordance with this embodiment is observed with a magnifying power of fifty thousands by an SEM. It is apparent from FIG. 10 that the larger grain size of the crystal grain is realized in comparison with FIG. 6.

A TFT is manufactured by using a crystalline semiconductor film having such crystal grains, whereby the satisfactory electric characteristics are obtained.

Embodiment 3

Another structure of the present invention, which is different from those of Embodiments 1 and 2, is described below with reference to FIGS. 22A to 24E.

First, a method of manufacturing a reflecting member is described with reference to FIGS. 22A and 22B. In FIGS. 22A and 22B, as a substrate 220, a glass substrate or a synthetic quartz glass substrate is used. Further, a plastic substrate having heat resistance that withstands a process temperature may be used. In this embodiment, 1737 substrate glass of Corning Corp. is used.

Then, a reflecting film 221 is deposited on the substrate 220 by a known means (a sputtering method, an LPCVD method, a plasma CVD method or the like). As the reflecting film 221, a film with high reflectivity to a wavelength of a laser beam used in crystallization and also with heat resistance that withstands the process temperature is desirable. The reflectivity most suitable for crystallization depends on the state of a semiconductor film, the wavelength of the laser beam and the like. In this embodiment, tantalum (Ta) is formed by the sputtering method.

Thereafter, the reflecting film is patterned into a desired shape to form a plurality of reflecting layers 222. In FIG. 22B, there are shown a cross sectional view and a top view of a substrate on which the reflecting layers are formed. It is preferable that the width of each of the reflecting layers 222 and the interval between the reflecting layers 222 are determined taking the size of a crystal grain to be formed into consideration. In this embodiment, the size of the crystal grain is estimated at 3 μm, the width of each of the reflecting layers is set to 6 μm, and the reflecting layers are formed at 0.5 μm intervals.

As described above, the reflecting member is manufactured.

Next, a method of manufacturing a semiconductor film substrate is described with reference to FIG. 23. As a substrate 230, a substrate having a light transmitting property is desirable, and a glass substrate or a synthetic quartz glass substrate is desirably used. The 1737 substrate glass of Corning Corp. is used in this embodiment. Then, a base insulating film 231 and a semiconductor film 232 are formed on the substrate 230 by a known means (a sputtering method, an LPCVD method, a plasma CVD method or the like). The base insulating film 231 is a film with high transmissivity such as a silicon oxide film or a silicon oxynitride film with respect to a wavelength of a laser beam used in crystallization. In this embodiment, the silicon oxide film is formed with a thickness of 150 nm and an amorphous silicon film is formed in succession with a thickness of 55 nm by the plasma CVD method.

As described above, the semiconductor film substrate is manufactured.

The semiconductor film substrate and the reflecting member are prepared by the above-described manufacturing methods, and crystallization of the semiconductor film is conducted. In the crystallization process, it is preferable that hydrogen contained in the semiconductor film is let out in advance. It is preferable that a heating process is performed at 400 to 500° C. for approximately one hour in order that the amount of the contained hydrogen is made to 5% or less of the total number of atoms contained in the semiconductor film and then, the crystallization is conducted since the roughness of the film surface can be prevented.

Then, as shown in FIG. 24A, the reflecting member is provided on the lower side of the semiconductor film substrate, and the semiconductor film substrate is irradiated with a laser beam 241 from the upper side. At this time, the semiconductor film substrate and the reflecting member may be arranged so as to be in contact with each other. Further, a laser beam with a wavelength of 350 nm or more (preferably 400 nm or more) is used as the laser beam 241. For example, a YAG laser, a glass laser, an Ar laser, a YLF laser, a $YVO_4$ laser or the like may be used. When the above laser is used, it is preferable that a method of condensing a laser beam emitted from a laser oscillator into a linear shape in an optical system and irradiating a semiconductor film with the linear laser beam is used. Although the crystallization condition is appropriately selected by an operator, in case of using second harmonic of the YAG laser, it is preferable that the pulse oscillation frequency is set to 1 to 300 Hz and the laser energy density is set to 300 to 1000 mJ/cm² (typically, 350 to 800 mJ/cm²). Then, the laser beam condensed into a linear shape with a width of 100 to 1000 μm, for example, 400 μm is irradiated over the entire surface of the substrate. At this time, irradiation may be conducted with an overlap ratio of 50 to 98%. In this embodiment, laser annealing is conducted using the second harmonic of the YAG laser.

The laser beam that has penetrated the semiconductor film substrate becomes a laser beam 242 reflected by a reflecting layer and a laser beam 243 not reflected by the reflecting layer. The reflected laser beam 242 partially irradiates the semiconductor film 232 again.

The semiconductor film 232 becomes in a completely melted state by irradiation of the laser beams 241 and 242. In the semiconductor film 232, a region irradiated with the laser beam 242 reflected by the reflecting layer and a region not irradiated with the laser beam 242 reflected by the reflecting layer exist. Because of the above-described distribution of the irradiation intensity of the laser beam, a temperature distribution shown in FIG. 24C is made in the semiconductor film. In the semiconductor film, a region at a low temperature is cooled faster than a region at a high temperature, and crystal nuclei 245 are generated. At this time, the region at a high temperature is still in the completely melted state. It takes time in a degree until the crystal nuclei are generated in a completely melted region. Therefore, until the crystal nuclei are generated in the completely melted region, a solid-liquid interface, which is the tip of the crystal growth, moves in a lateral direction, and the crystal nuclei 245 each grow into a crystal grain of large grain size. Thus, the crystal grains of large grain size are formed in the semiconductor film above the reflecting layers. That is, if the reflecting layers are formed into a desired shape, the crystal grains of large grain size can be formed at arbitrary positions in the semiconductor film.

As described above, a crystalline semiconductor film 246, which is position-controlled and also has crystal grains of large grain size, can be formed.

Embodiment 4

In this embodiment, a description is made on the case where a reflecting member is manufactured and provided on a rear surface side of a semiconductor film substrate and crystallization of a semiconductor film is conducted.

First, a method of manufacturing a reflecting member is described with reference to FIGS. 22A and 22B. In FIGS. 22A and 22B, 1737 substrate glass of Corning Corp. is used as a substrate 220. Then, a silicon oxynitride film with a thickness of 50 nm is formed on the substrate 220 by a CVD method, and a W film with a thickness of 200 nm is formed by a sputtering method. Thereafter, patterning is performed to form the reflecting member in which the W films each having a width of 10 µm are formed at 10 µm intervals.

Next, a method of manufacturing a semiconductor film substrate is described with reference to FIG. 23. The 1737 substrate glass of Corning Corp. is used as a substrate 230. Then, a silicon oxynitride film with a thickness of 100 nm as a base insulating film 231 is formed on the substrate 230 by the CVD method, and an amorphous silicon film with a thickness of 54 nm as a semiconductor film 232 is formed in succession by the CVD method.

The semiconductor film substrate and the reflecting member are prepared by the above-described manufacturing methods, and crystallization of the semiconductor film is conducted. In the crystallization process, it is preferable that hydrogen contained in the semiconductor film is let out in advance. It is preferable that a heating process is performed at 400 to 500° C. for approximately one hour in order that the amount of the contained hydrogen is made to 5% or less of the total number of atoms contained in the semiconductor film and then, the crystallization is conducted since the roughness of the film surface can be prevented. In this embodiment, the heating process is conducted at 500° C. for one hour.

Then, as shown in FIG. 24A, the reflecting member is provided on the lower side of the semiconductor film substrate, and the semiconductor film substrate is irradiated with a laser beam 241 from the upper side. At this time, the semiconductor film substrate and the reflecting member may be arranged so as to be in contact with each other. In this embodiment, an interval of 1.1 mm is provided therebetween. Further, a laser beam with a wavelength of 350 nm or more (preferably 400 nm or more) is used as the laser beam 241. For example, a YAG laser, a glass laser, an Ar laser, a YLF laser, a $YVO_4$ laser or the like may be used. When the above laser is used, it is preferable that a method of condensing a laser beam emitted from a laser oscillator into a linear shape in an optical system and irradiating a semiconductor film with the linear laser beam is used. In this embodiment, laser annealing is conducted using second harmonic of the YAG laser.

The laser beam that has penetrated the semiconductor film substrate becomes a laser beam 242 reflected by a reflecting layer and a laser beam 243 not reflected by the reflecting layer. The reflected laser beam 242 partially irradiates the semiconductor film 232 again.

Figure 25:
FIG. 25 is a diagram of an example of crystal grains in conducting laser annealing using a YAG laser.

Seco-etching is conducted to the formed crystalline semiconductor film as described above, and FIG. 25 shows the result of the SEM observation with a magnifying power of thirty thousands. It is apparent from FIG. 25 that a crystalline semiconductor film 246, which is position-controlled and also has crystal grains of large grain size, is formed.

Embodiment 5

In this embodiment, an arrangement example of a reflecting layer in a reflecting member is described with reference to FIGS. 26A to 27C.

First, the state of FIG. 22A is obtained in accordance with Embodiment 1.

Figure 26A:
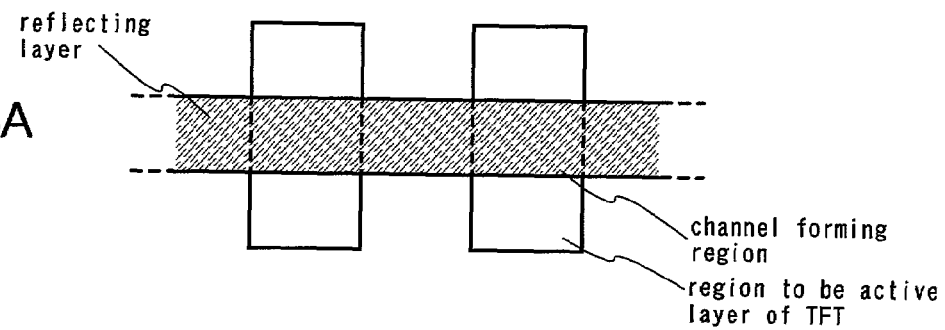
FIGS. 26A to 26C are diagrams of arrangement examples of a reflecting layer on a reflecting member disclosed in the present invention.

Then, a reflecting film is etched such that a portion that becomes a channel forming region of a TFT in a semiconductor film and the reflecting layer in the reflecting member overlap with each other to thereby form the reflecting layer (FIG. 26A). By forming the reflecting layer as described above, crystal grains of large grain size are formed in the channel forming region when crystallization of the semiconductor film is conducted by laser annealing.

Figure 26B:
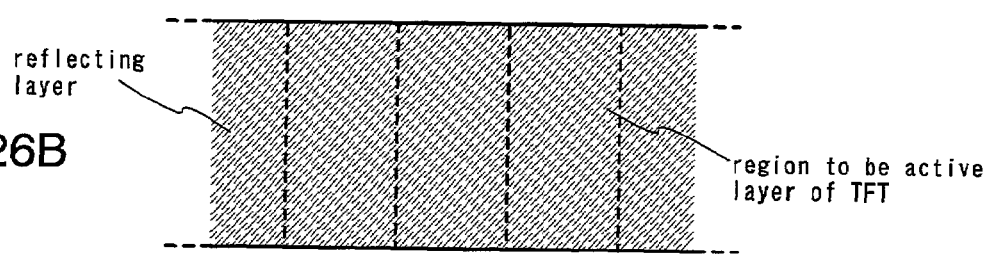
Figure 26C:
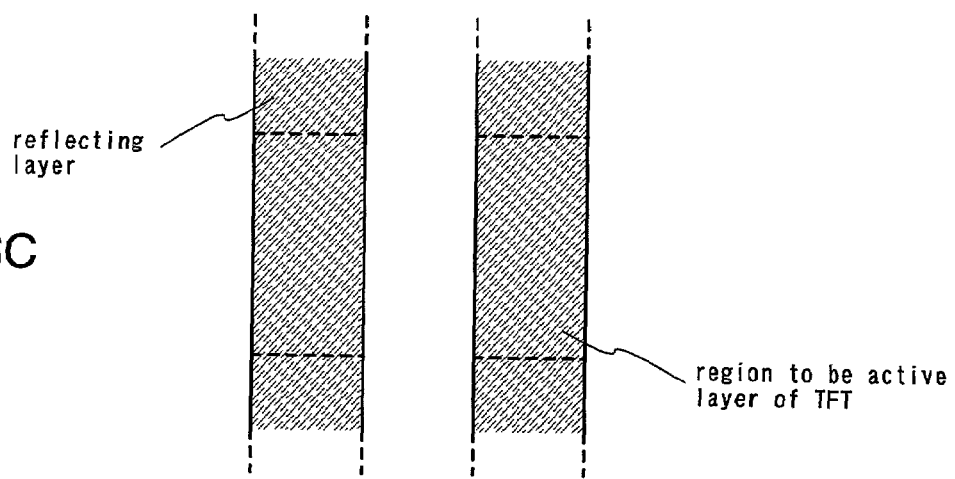

Further, a reflecting film is etched such that a portion that becomes an active region of a TFT in a semiconductor film and the reflecting layer in the reflecting member overlap with each other to thereby form the reflecting layer (FIG. 26B and FIG. 26C). By forming the reflecting layer as described above, crystal grains of large grain size are formed in the active region when crystallization of the semiconductor film is conducted by laser annealing.

Figure 27A:
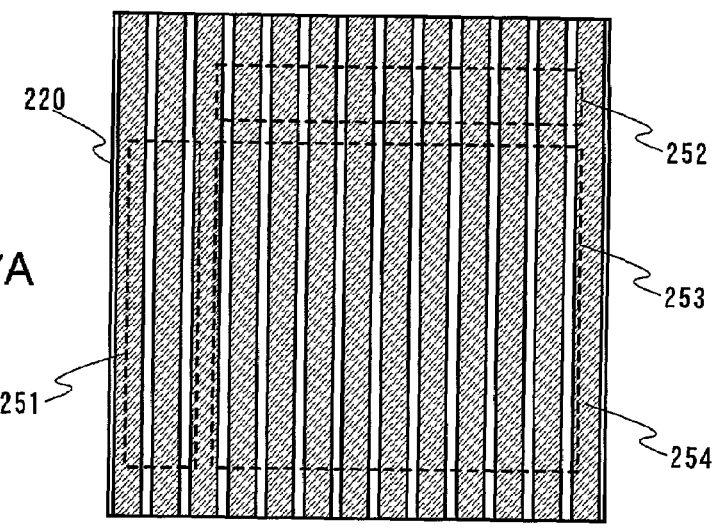
FIGS. 27A to 27C are diagrams of arrangement examples of the reflecting layer on the reflecting member disclosed in the present invention.
Figure 27B:
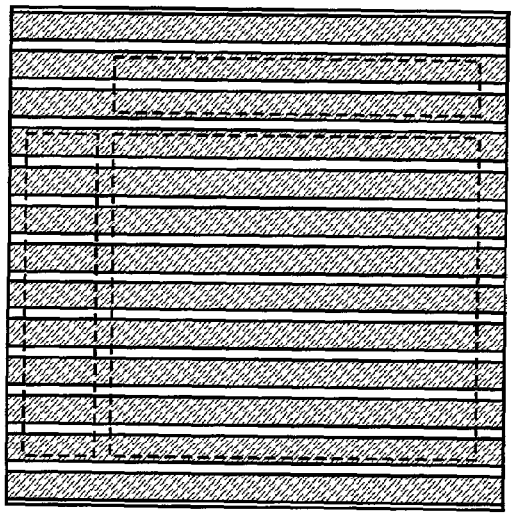
Figure 27C:
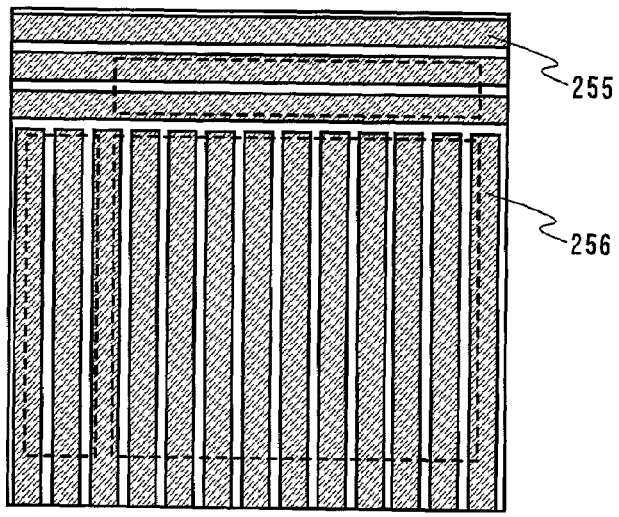

Moreover, there is a method of forming reflecting layers 254 in the reflecting member as shown in FIG. 27A and FIG. 27C while taking into consideration regions where a gate driver 251, a source driver 252 and a pixel 254 are formed, respectively in a semiconductor film substrate.

Furthermore, if the reflecting member manufactured in FIG. 27A is used after being rotated at 90 degrees, an arrangement shown in FIG. 27B is obtained.

As described above, there are various methods of arranging the reflecting layers in the reflecting member. However, in any case, the reflecting member is provided on the lower side of the semiconductor film substrate, and the laser beam is irradiated from the upper side of the semiconductor film substrate to perform crystallization of the semiconductor film, whereby crystal grains of large grain size can be formed at desirable positions.

Note that FIGS. 26A to 27C show examples of the arrangement of the reflecting layers and the method of arranging the reflecting layers is not limited to the above examples. Further, the reflecting layers do not need to be formed with the same width, length and interval.

Embodiment 6

In this embodiment, a method of manufacturing an active matrix substrate is described with reference to FIGS. 11A to 14.

First, a reflecting member is manufactured. As a substrate 303 of the reflecting member, a substrate formed of glass such as barium borosilicate glass or alumino borosilicate glass typified by 7059 glass or 1737 glass of Corning Corp. or a quartz substrate is used. Further, a plastic substrate having heat resistance that withstands a process temperature of this embodiment may be used. In this embodiment, the 1737 glass substrate is used. A reflecting film is deposited on the substrate 303 by a known means (a sputtering method, an LPCVD method, a plasma CVD method or the like). As the reflecting film, a film with high reflectivity to a wavelength of a laser beam used in crystallization and also with heat resistance that withstands the process temperature is desirable. The reflectivity most suitable for crystallization depends on the state of a semiconductor film, the wavelength of the laser beam and the like. In this embodiment, tantalum (Ta) is formed by the sputtering method.

As described above, the reflecting member can be manufactured (FIG. 11A).

Next, a semiconductor film substrate is manufactured. As a substrate 300 of the semiconductor film substrate, the substrate formed of glass such as barium borosilicate glass or alumino borosilicate glass typified by 7059 glass or 1737 glass of Corning Corp. or a synthetic quartz glass substrate is used. Further, the plastic substrate having heat resistance that withstands the process temperature of this embodiment may be used. In this embodiment, the substrate made of 1737 glass of Corning Corp. is used.

Subsequently, a base film 301 formed of an insulating film such as a silicon oxide film, a silicon nitride film or a silicon oxynitride film is formed on the substrate 300. In this embodiment, a two-layer structure is adopted for the base film 301, but a single layer or a lamination structure of two or more layers of the above insulating film may be adopted. As the first layer of the base film 301, a silicon oxynitride film 301*a* is formed with a thickness of 10 to 200 nm (preferably, 50 to 100 nm) and with $SiH_4$, $NH_3$ and $N_2O$ as reaction gases by the plasma CVD method. In this embodiment, the silicon oxynitride film 301*a* (composition ratio: Si=32%, O=27%, N=24% and H=17%) is formed with a thickness of 50 nm. Next, as the second layer of the base film 301, a silicon oxynitride film 301*b* is formed on the first layer and formed with a thickness of 50 to 200 nm (preferably 100 to 150 nm) and with $SiH_4$ and $N_2O$ as reaction gases by the plasma CVD method. In this embodiment, the silicon oxynitride film 301*b* (composition ratio: Si=32%, O=59%, N=7% and H=2%) is formed with a thickness of 100 nm.

Next, a semiconductor film 302 is formed on the base film. The semiconductor film 302 is formed of a semiconductor film having an amorphous structure to have a thickness of 25 to 80 nm (preferably 30 to 60 nm) by a known means (a sputtering method, an LPCVD method, a plasma CVD method or the like). There is no limitation on a material of the semiconductor film, but the semiconductor film is preferably formed of silicon or a silicon germanium (SiGe) alloy. In this embodiment, an amorphous silicon film with a thickness of 55 nm is deposited by the plasma CVD method.

The semiconductor film substrate and the reflecting member are prepared by the above-described methods, and crystallization of the semiconductor film is conducted. In the crystallization process, it is preferable that hydrogen contained in the semiconductor film is let out in advance. It is preferable that a heating process is performed at 400 to 500° C. for approximately one hour in order that the amount of the contained hydrogen is made to 5% or less of the total number of atoms contained in the semiconductor film and then, the crystallization is conducted since the roughness of the film surface can be prevented.

Then, as shown in FIG. 11A, the reflecting member is provided on a rear surface side of the semiconductor film substrate, and the semiconductor film substrate is irradiated with a laser beam from the upper side. At this time, the semiconductor film substrate and the reflecting member may be arranged so as to be in contact with each other. Further, a laser beam with a wavelength of 350 nm or more (preferably 400 nm or more) is used as the laser beam. For example, a YAG laser, a glass laser, an Ar laser, a YLF laser, a $YVO_4$ laser or the like may be used. When the above laser is used, it is preferable that a method of condensing a laser beam emitted from a laser oscillator into a linear shape in an optical system and irradiating a semiconductor film with the linear laser beam is used. Although the crystallization condition is appropriately selected by an operator, in case of using second harmonic of the YAG laser, it is preferable that the pulse oscillation frequency is set to 1 to 300 Hz and the laser energy density is set to 300 to 1000 $mJ/cm^2$ (typically 350 to 800 $mJ/cm^2$). Then, the laser beam condensed into a linear shape with a width of 100 to 1000 μm, for example, 400 μm is irradiated over the entire surface of the substrate. Further, in case of using the second harmonic of the YLF laser of continuous oscillation type, irradiation is desirably conducted such that the energy density is set to approximately 0.01 to 100 $MW/cm^2$ (preferably 0.1 to 10 $MW/cm^2$) and the semiconductor film is made to move relatively to the laser light with a rate of approximately 0.5 to 2000 cm/s. In this embodiment, the second harmonic of the YAG laser is processed into a linear shape by using the optical system, and laser annealing is conducted using the processed second harmonic.

An effective energy density to the semiconductor film is raised by the irradiation of the laser beam to the substrate from the front surface side and the rear surface side. Further, an effective output time of the laser beam to the semiconductor film is extended, and the heat retaining effect of the base insulating film is obtained, whereby the cooling process from the melted state of the semiconductor film can be made gentle. As a result, crystal grains of large grain size can be formed in the semiconductor film.

Subsequently, the crystalline semiconductor film is subjected to a patterning process using a photolithography method to form semiconductor layers 402 to 406.

After the semiconductor layers 402 to 406 are formed, doping of a small amount of an impurity element (boron or phosphorous) may be conducted for a threshold control of a TFT.

A gate insulating film 407 is formed next, covering the semiconductor layers 402 to 406. The gate insulating film 407 is formed by an insulating film containing silicon with a thickness of 40 to 150 nm using plasma CVD or sputtering. In Embodiment 6, a silicon oxynitride film having a film thickness of 110 nm (composition ratios: Si=32%; O=59%; N=7%; H=2%) is formed using plasma CVD. The gate insulating film is of course not limited to a silicon oxynitride film, and other insulating films containing silicon may be used in a single layer or in a lamination structure.

Further, when using a silicon oxide film, it can be formed by plasma CVD with a mixture of TEOS (tetraethyl orthosilicate) and $O_2$, at a reaction pressure of 40 Pa, with the substrate temperature set from 300 to 400° C., and by discharging at a high frequency (13.56 MHz) electric power density of 0.5 to 0.8 $W/cm^2$. Good characteristics as a gate insulating film can be obtained by subsequently performing thermal annealing, between 400 and 500° C., of the silicon oxide film thus manufactured.

A conductive film 408, made from 100 to 400 nm thick, is then formed on the gate insulating film 407, as shown in FIG. 11B. The conductive film 408, made from a 400 nm thick W film, are formed and laminated in Embodiment 6. Further, the W film is formed by sputtering using a W target. In addition, the W film can also be formed by thermal CVD using tungsten hexafluoride ($WF_6$). Whichever is used, it is necessary to be able to make the film become low resistance in order to use it as a gate electrode, and it is preferable that the resistivity of the W film be made equal to or less than 20 μΩcm. The resistivity can be lowered by enlarging the crystal grains of the W film, but for cases in which there are many impurity elements such as oxygen within the W film, crystallization is inhibited, and the film becomes high resistance. A high purity W target (99.9999% purity) is therefore used in sputtering. In addition, by forming the W film while taking sufficient care that no impurities from within the gas phase are introduced at the time of film formation, a resistivity of 9 to 20 μΩcm can be achieved.

Note that, the conductive film 408 is W in Embodiment 6, the conductive films are not limited to these. In any case, the conductive film may also be formed from an element selected from the group consisting of Ta, W, Ti, Mo, Al, Cu, Cr, and Nd, or from an alloy material having one of these elements as its main constituent, or from a chemical compound of these elements. Further, a semiconductor film, typically a poly-silicon film, into which an impurity element such as phosphorus is doped may also be used, as may an AgPdCu alloy.

Masks 410 to 415 are formed next from photo-resist using photolithography, and a first etching process is performed in order to form electrodes and wirings. An ICP (inductively coupled plasma) etching method is used in Embodiment 6 as the first etching condition. A gas mixture of $CF_4$, $Cl_2$, and $O_2$ is used as an etching gas, the gas flow rates are set to 25/25/10 sccm, respectively, a plasma is generated by applying a 500 W RF electric power (13.56 MHz) to a coil shape electrode at 1 Pa, and etching is performed. A Matsushita Electric Inc. Dry etching apparatus (model E645-□ICP) using ICP is employed. A 150 W RF electric power (13.56 MHz) is also applied to the substrate side (test piece stage), effectively applying a negative self-bias. The W film is etched under the first etching conditions, and the edge portion of the first conductive layer is made into a tapered shape. Note that in order for etching to be performed such that nothing remains on the gate insulating film, the etching time may be increased on the order of 10 to 20%.

Edge portions of the conductive layer is made into a tapered shape in accordance with the effect of the bias voltage applied to the substrate side with the above etching conditions by using a suitable resist mask shape. The angle of the tapered portions is from 15 to 45°. Reference numeral 416 denotes the gate insulating film, and regions not covered by the first shape conductive layer 408 are formed into regions which become thinner by approximately 20 to 50 nm after etching.

A first doping process is then performed without removing the resist masks, adding an impurity element which imparts n-type conductivity (see FIG. 12A). The doping process may be performed by ion doping or ion implantation. Ion doping is performed with process conditions in which the dosage is set from $1\times10^{12}$ to $5\times10^{15}$ atoms/cm$^2$, and the acceleration voltage is set between 30 to 120 keV. Doping is performed in Embodiment 6 with the dosage set to $1.5\times10^{14}$ atoms/cm$^2$, and the acceleration voltage set to 80 keV An element residing in group 15 of the periodic table, typically phosphorus (P) or arsenic (As) is used as an impurity element which imparts n-type conductivity, and phosphorus (P) is used here. In this case the conductive layers 417 to 421 act as masks with respect to the n-type conductivity imparting impurity element, and low concentration impurity regions 306 to 310 are formed in a self-aligning manner.

After removing the resist masks, new resist masks 320a to 320e made from resist are formed and a second doping process is performed as shown in FIG. 12B. In this case, the dosage is less than that of the first doping process, and high concentration impurity element is added. The acceleration voltage is set between 30 to 120 keV. The impurity element is added to the high concentration impurity element regions 423a to 427e in which the dosage set from $1\times10^{20}$ to $1\times10^{21}$ atoms/cm$^3$. Doping is performed in Embodiment 6 with the dosage set to $1.5\times10^{15}$ atoms/cm$^2$, and the acceleration voltage set to 80 keV. Thus the high concentration impurity element regions 423a to 427a and the low concentration impurity regions 423b to 427b are formed.

After removing the resist masks, new masks 445a to 445c made from resist are formed and a third doping process is performed. (FIG. 12C) Impurity regions 446a and 447a, to which an impurity element which imparts a conductivity type opposite that of the above single conductivity type is added, are formed from the semiconductor layers which become active layers of the p-channel TFT in accordance with the third doping process. The conductive layers 418 and 421 are used as masks with respect to the impurity element, and an impurity element which imparts p-type conductivity is added, forming the impurity regions in a self-aligning manner. The impurity regions 446a and 447a are formed by ion doping using diborane ($B_2H_6$) in Embodiment 6. The semiconductor layers for forming the n-channel TFT are covered by the resist masks 445a and 445c when performing the third doping process. Phosphorus is added at differing concentrations into the impurity regions 446a and 447a by the first doping process and by the second doping process, but by performing doping such that the concentration of the p-type conductivity imparting impurity element becomes from $2\times10^{20}$ to $2\times10^{21}$ atoms/cm$^3$ in each of the regions, no problems will develop in making the regions function as source regions and drain regions of the p-channel TFT.

The impurity regions are thus formed in the various semiconductor layers by the processes up to this point.

A first interlayer insulating film 461 is formed next after removing the resist masks 445a to 445c. (FIG. 13A) The first interlayer insulating film 461 is formed from an insulating film containing silicon, having a thickness of 100 to 200 nm, by using plasma CVD or sputtering. A 150 nm thick silicon oxynitride film is formed by plasma CVD in Embodiment 6. The first interlayer insulating film 461 is of course not limited to a silicon oxynitride film, and other insulating films containing silicon may also be used, as a single layer or a lamination structure.

Figures 13A, 13B:
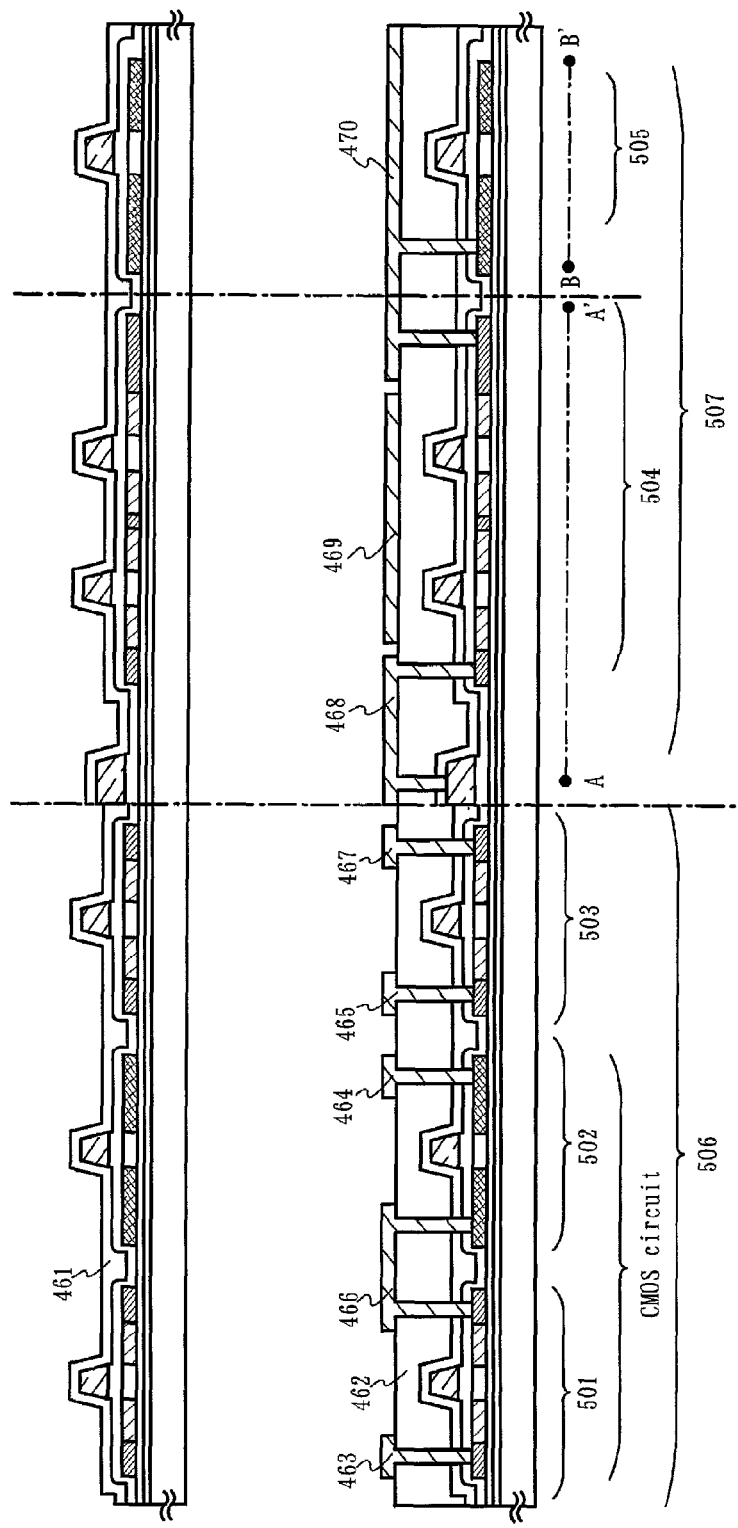
FIGS. 13A and 13B are cross sectional views of an example of the manufacturing process of the pixel TFT and the TFTs of the driver circuit.
Figure 14:
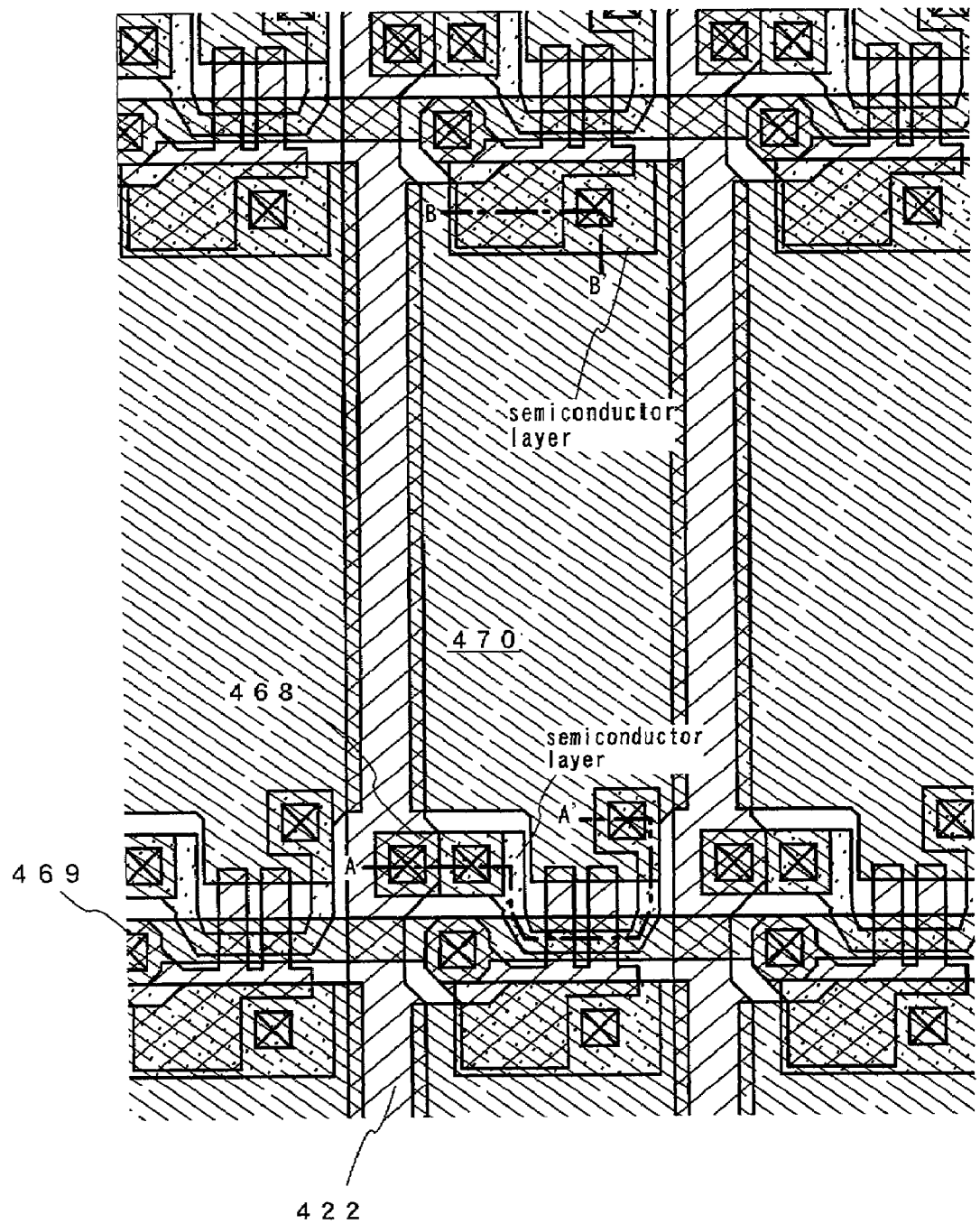
FIG. 14 is a top view showing pixels of a pixel portion.

A process of activating the crystalline of the semiconductor layers and the impurity elements added to the respective semiconductor layers is performed next, as shown in FIG. 13A. Thermal annealing using an annealing furnace is performed for this process. Thermal annealing is performed with an oxygen concentration equal to or less than 1 ppm, preferably equal to or less than 0.1 ppm, in a nitrogen environment at 400 to 700° C., typically between 500 and 550° C. Heat treatment is performed for 4 hours at 550° C. in Embodiment 6. Note that, in addition to thermal annealing, laser annealing and rapid thermal annealing (RTA) can also be applied. In the case of using the laser annealing, the present invention shown in Embodiments 1 to 5 can be applied to implement. A solid laser of a continuous oscillation or a pulse oscillation, a gaseous laser and metallic laser can be used here as a laser. Further, when the continuous oscillation laser is used, the energy density is set about 0.01 to 100 MW/cm$^2$, (preferably 0.01 to 1 MW/cm$^2$) and preferably, the semiconductor film is moved relatively to the laser light at the 0.5 to 2000 cm/s speed and irradiated. Moreover, when using the pulse oscillation laser, the energy density is desirably set from 50 to 1000 mJ/cm$^2$ (typically 100 to 600 mJ/cm$^2$).

Further, heat treatment may also be performed before the formation of the first interlayer insulating film. However, if the wiring material used is weak with respect to heat, it is preferable to perform activation after forming an interlayer insulating film (an insulating film having silicon as its main constituent, for example a silicon nitride film) in order to protect the wirings and the like, as in Embodiment 6.

In addition, heat treatment is performed for 1 to 12 hours at 300 to 550° C. in an atmosphere containing between 3 and 100% hydrogen, performing hydrogenation of the semiconductor layers. In Embodiment 6, the heat treatment is performed for 1 hour at 410° C. in a nitrogen atmosphere containing about 3% hydrogen. This process is one of terminating dangling bonds in the island shape semiconductor layers by hydrogen contained within the first interlayer insulating film. Plasma hydrogenation (using hydrogen excited by a plasma) may also be performed as another means of hydrogenation.

Further, if laser annealing is used as the activation process, then it is preferable to irradiate the laser beam, such as that of an excimer laser or a YAG laser, after performing the above-mentioned hydrogenation process.

A second interlayer insulating film 462 made from an inorganic insulating material or from an organic insulating material is formed next on the first interlayer insulating film 461. An acrylic resin film having a film thickness of 1.6 μm is formed in Embodiment 6, and the material used may have a viscosity from 10 to 1000 cp, preferably between 40 and 200 cp. A material in which unevenness is formed on its surface is used.

In order to prevent specular reflection, the surface of a pixel electrode is made uneven by forming the second interlayer insulating film from a material which forms an uneven surface in Embodiment 6. Further, the electrode surface can be made to be uneven and have light scattering characteristics, and therefore a convex portion may also be formed in a region below the pixel electrode. The formation of the convex portion can be performed by the same photomask as that for forming the TFTs, and therefore it can be formed without increasing the number of process steps. Note that the convex portion may also be formed suitably on the substrate pixel portion region outside of the wirings and TFTs. Unevenness is formed in the surface of the pixel electrode along the unevenness formed in the surface of the insulating film which covers the convex portion.

A film having a level surface may also be used as the second interlayer insulating film 462. In this case, after the formation of the pixel electrodes, it is preferable that the surface be made uneven by an added process such as a known sandblast process or etching process, preventing specular reflection, and increasing the whiteness by scattering reflected light.

Wirings 463 to 467 for electrically connecting the various impurity regions are then formed in a driver circuit 506 in order. Note that a lamination film of a 50 nm thick Ti film and a 500 nm thick alloy film (an alloy of Al and Ti) is patterned for forming the wirings.

Furthermore, a pixel electrode 470, a gate wiring 469, and a connection electrode 468 are formed in a pixel portion 507. (FIG. 13B) An electrical connection is formed with the pixel TFT and the source wiring (lamination of the impurity regions 443b and 449) by the connection electrode 468. Further, the gate wiring 469 forms an electrical connection with the gate electrode of the pixel TFT. The pixel electrode 470 forms an electrical connection with the drain region 442 of the pixel TFT, and in addition, forms an electrical connection with the semiconductor layer 458 which functions as one electrode forming the storage capacitor. It is preferable to use a material having superior reflectivity, such as a film having Al or Ag as its main constituent, or a lamination film of such films, as the pixel electrode 470.

A CMOS circuit composed of an n-channel TFT 501 and a p-channel TFT 502, a driver circuit 506 having an n-channel TFT 503, and the pixel portion 507 having a pixel TFT 504 and a storage capacitor 505 can thus be formed on the same substrate, and FPC is adhered on them by a known method.

The liquid crystal display panel manufactured by above-mentioned steps can be used as a display portion of various kinds of electronic devices.

Incidentally, Embodiment 6 can be freely combined with any structure of embodiments 1 to 5.

Embodiment 7

In this embodiment, an example in which a light emitting device is manufactured according to the present invention is described. In this specification, the light emitting device is the generic name for a display panel in which a light emitting element formed on a substrate is sealed between the substrate and a covering member and a display module in which an IC is mounted to the display panel. Note that the light emitting element has a layer containing an organic compound by which luminescence generated by application of an electric field (electro luminescence) is obtained (light emitting layer), an anode layer and a cathode layer. Further, the light emission in returning to a base state from a singlet excitation state (fluorescence) and the light emission in returning to a base state from a triplet excitation state (phosphorescence) exist as the luminescence in the organic compound, and the luminescence includes one or both of the light emissions.

Note that, in this specification, all the layers formed between an anode and a cathode in the light emitting element are defined as organic light emitting layers. The organic light emitting layers specifically include a light emitting layer, a hole injecting layer, an electron injecting layer, a hole transporting layer, an electron transporting layer and the like. The light emitting element basically has the structure in which the anode layer, the light emitting layer and the cathode layer are laminated in order, and may also have the structure in which the anode layer, the hole injecting layer, the light emitting layer and the cathode layer are laminated in order or the structure in which the anode layer, the hole injecting layer, the light emitting layer, the electron transporting layer and the cathode layer are laminated in order.

Figure 15:
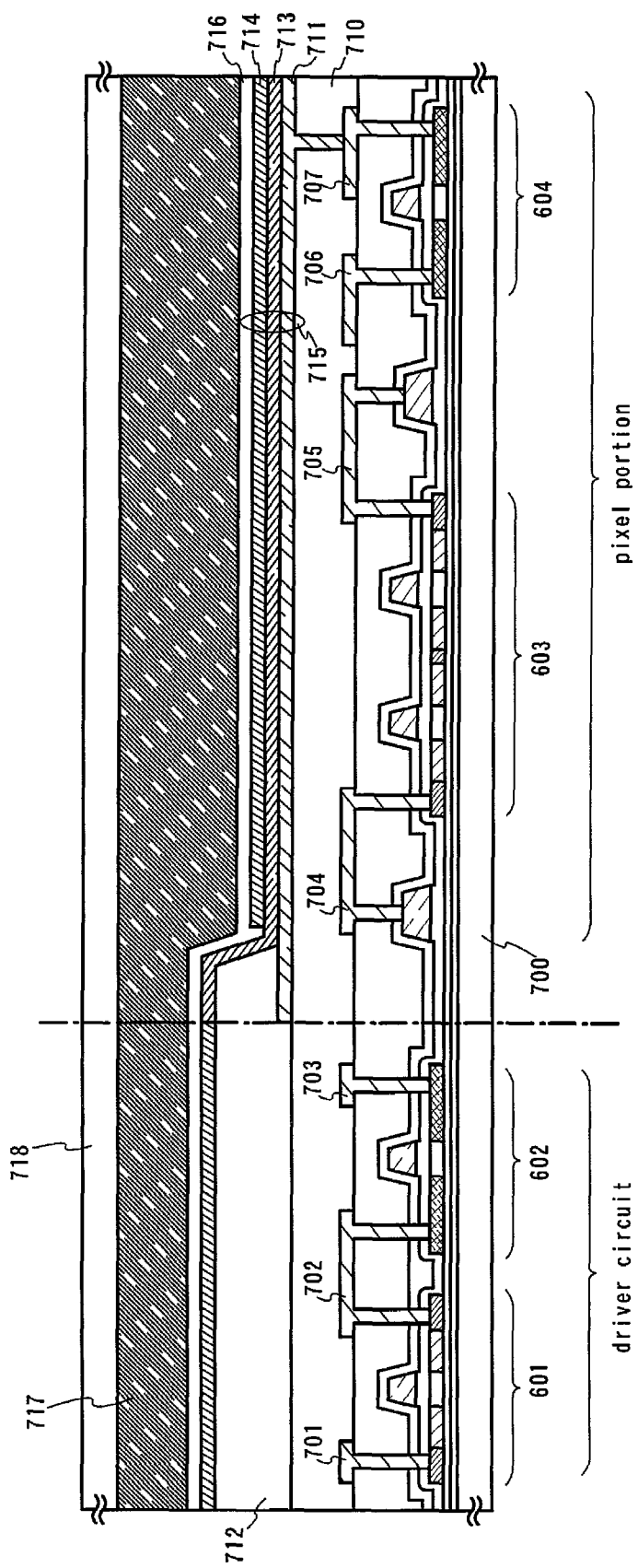
FIG. 15 is a cross sectional structural view of a driver circuit and a pixel portion of a light emitting device.

FIG. 15 is a cross sectional view of the light emitting device of the present invention. In FIG. 15, a switching TFT 603 provided on a substrate 700 is formed using an n-channel TFT 503 of FIG. 13B. Therefore, the description of the n-channel TFT 503 may be referred for the description of the structure of the switching TFT 603.

Note that a double gate structure in which two channel forming regions are formed is adopted in this embodiment. However, a single gate structure in which one channel forming region is formed or a triple gate structure in which three channel forming regions are formed may also be adopted.

A driver circuit provided on the substrate 700 is formed by using a CMOS circuit of FIG. 13B. Therefore, the description of an n-channel TFT 501 and a p-channel TFT 502 may be referred for the description of the structure of the CMOS circuit. Note that the single gate structure is adopted in this embodiment, but the double gate structure or the triple gate structure may also be adopted.

Further, wirings 701 and 703 function as source wirings of the CMOS circuit, and a wiring 702 functions as a drain wiring. Further, a wiring 704 functions as a wiring for electrically connecting a source wiring 708 to a source region of the switching TFT, and a wiring 705 functions as a wiring for electrically connecting a drain wiring 709 to a drain region of the switching TFT.

Note that a current control TFT 604 is formed using the p-channel TFT 502 in FIG. 13B. Therefore, the description of the p-channel TFT 502 may be referred for the description of the structure of the current control TFT 604. Note that the single gate structure is adopted in this embodiment, but the double gate structure or the triple gate structure may also be adopted.

Further, a wiring 706 is a source wiring (corresponding to a current supply line) of the current control TFT, and reference numeral 707 indicates an electrode electrically connected to a pixel electrode 711 formed in the subsequent step.

Reference numeral 710 indicates a third interlayer insulating film comprised of an inorganic insulating material or an organic insulating material. Further, a leveling film may be used as the second interlayer insulating film 710.

Then, the pixel electrode 711 electrically connected to the electrode 706 is formed in a pixel portion. Note that the pixel electrode 711 is one (anode of the light emitting element) formed of a transparent conductive film. As the transparent conductive film, a compound of indium oxide and tin oxide, a compound of indium oxide and zinc oxide, zinc oxide, tin oxide or indium oxide may be used. Further, the transparent conductive film added with gallium may also be used.

After the pixel electrode 711 is formed, a bank 712 is formed as shown in FIG. 15. The bank 712 is formed by patterning an insulating film or an organic resin film containing silicon with a thickness of 100 to 400 nm. Note that the bank 712 is formed of the insulating film, and thus, attention needs to be paid on electrostatic breakdown of an element in film deposition. In this embodiment, carbon particles or metal particles are added to the inside of the insulating film as the material for the bank 712 to lower the resistivity, and generation of static electricity is suppressed. At this time, the amount of the carbon particles or the metal particles to be added may be adjusted such that the resistivity is lowered to $1 \times 10^6$ to $1 \times 10^{12}$ $\Omega$m (preferably $1 \times 10^8$ to $1 \times 10^{10}$ $\Omega$m).

A light emitting layer 713 is formed on the pixel electrode 711. Note that only one pixel is shown in FIG. 15, but light emitting layers corresponding to respective colors of R (red), G (green) and B (blue) are formed in this embodiment. Further, a low molecular organic light emitting material is formed by an evaporation method in this embodiment. Specifically, a lamination structure is taken in which a copper phthalocyanine (CuPc) film with a thickness of 20 nm is provided as the hole injecting layer and a tris-8-quinolinolate aluminum complex ($Alq_3$) film with a thickness of 70 nm is provided thereon as the light emitting layer. A light emitting color can be controlled by adding a fluorescent pigment such as quinacridon, perylene or DCM1 to $Alq_3$.

However, the above example is one example of the organic light emitting material that can be used for the light emitting layer, and the present invention does not need to be limited to the example at all. The light emitting layer (layer for light emission and movement of carriers for light emission) may be formed by freely combining a light emitting layer, a charge transporting layer and a charge injecting layer. For example, the example in which the low molecular organic light emitting material is used for the light emitting layer is shown in this embodiment. However, a middle molecular organic light emitting material or a polymer organic light emitting material may also be used. Note that, in this specification, the middle molecular organic light emitting material indicates the organic light emitting material which has no sublimation property and in which the molecularity is twenty or less or the length of a chain of molecules is 10 μm or less. Further, regarding the example of using the polymer organic light emitting material, the lamination structure may be adopted in which a polythiophene (PEDOT) film with a thickness of 20 nm is provided as the hole injecting layer by a spin coating method and a paraphenylene vinylene (PPV) film with a thickness of approximately 100 nm is provided thereon as the light emitting layer. Note that emission wavelength can be selected from a red color to a blue color by using π-conjugated polymer of PPV Further, an inorganic material such as silicon carbide can be used for the charge transporting layer or the charge injecting layer. Known materials can be used as the organic light emitting material or the inorganic material.

Next, a cathode 714 formed of a conductive film is provided on the light emitting layer 713. In this embodiment, an alloy film comprised of aluminum and lithium is used as the conductive film. Of course, a known MgAg film (alloy film comprised of magnesium and silver) may also be used. A conductive film comprised of an element belonging to group 1 or group 2 of the periodic table or a conductive film to which the above element is added may be used as the cathode material.

At the time when the cathode 714 is completed, a light emitting element 715 is completed. Note that the light emitting element 715 mentioned here indicates a diode composed of the pixel electrode (anode) 711, the light emitting layer 713 and the cathode 714.

It is effective that a passivation film 716 is provided so as to completely cover the light emitting element 715. A single layer or a lamination structure of an insulating film comprising a carbon film, a silicon nitride film or a silicon oxynitride film is used as the passivation film 716.

At this time, a film with a satisfactory coverage is preferably used as the passivation film, and it is effective that the carbon film, particularly a DLC (diamond-like carbon) film is used. Since the DLC film may be formed in a temperature range of a room temperature to 100° C., the DLC film can be easily formed above the light emitting layer 713 with low heat resistance. Further, since the DLC film has a high blocking effect against oxygen, oxidization of the light emitting layer 713 can be suppressed. Therefore, the problem in that the light emitting layer 713 is oxidized during the subsequent sealing step can be overcome.

Further, a sealing material 717 is provided on the passivation film 716, and a covering member 718 is bonded thereto. An ultraviolet ray curing resin may be used as the sealing material 717, and it is effective that a substance having an absorbing effect or a substance having an oxidization preventing effect is provided in the sealing material 717. Moreover, in this embodiment, a glass substrate, a synthetic quartz glass substrate or a plastic substrate (including a plastic film) in which carbon films (preferably diamond-like carbon films) are formed on both the surfaces is used as the covering member 718.

Thus, the light emitting device with the structure shown in FIG. 15 is completed. Note that it is effective that the steps through the formation step of the passivation film 716 are continuously conducted without exposure to an atmosphere by using a film deposition device of multi-chamber system (or inline system) after the bank 712 is formed. Further, it is possible that the range of the continuously conducted steps is expanded and that the steps through the bonding step of the covering member 718 are continuously conducted without exposure to an atmosphere.

Further, as described above with reference to FIG. 15, the n-channel TFT resistant to deterioration due to a hot-carrier effect can be formed by providing the impurity region overlapping with the gate electrode through the insulating film. Therefore, the light emitting device with high reliability can be realized.

Further, although only the structures of the pixel portion and the driver circuit are shown in this embodiment, logic circuits such as a signal dividing circuit, a D/A converter, an operational amplifier and a â-correction circuit can also be formed on the same insulator in accordance with the manufacturing process in this embodiment. Furthermore, a memory and a microprocessor can also be formed.

Moreover, the light emitting device of this embodiment which is completed through the sealing (or enclosing) step for protecting the light emitting element is described with reference to FIGS. 16A and 16B. Note that the reference numerals used in FIG. 15 are used if necessary.

FIG. 16A is a top view showing the state that the steps through the step of sealing the light emitting element are completed, and FIG. 16B is a cross sectional view taken along a line C–C' of FIG. 16A. Reference numeral 801 indicates a source side driver circuit, 806 indicates a pixel portion, and 807 indicates a gate side driver circuit, which are indicated by doted lines. Further, reference numeral 901 indicates a covering member, 902 indicates a first sealing member and 903 indicates a second sealing member. A sealing material 907 is provided in the inside surrounded by the first sealing member 902.

Note that reference numeral 904 indicates a wiring for transmitting signals input to the source side driver circuit 801 and the gate side driver circuit 807 and the wiring receives a video signal and a clock signal from an FPC (flexible printed circuit) 905 that is an external input terminal. Note that although only the FPC is shown, a PWB (printed wiring board) may be attached to the FPC. The light emitting device in this specification includes not only the light emitting device main body but also the light emitting device attached with the FPC or the PWB.

Next, the cross sectional structure is described with reference to FIG. 16B. The pixel portion 806 and the gate side driver circuit 807 are formed above the substrate 700, and the pixel portion 806 is constituted of the current control TFT 604 and a plurality of pixels including the pixel electrode 711 electrically connected to the drain of the TFT. Further, the gate side driver circuit 807 is formed using the CMOS circuit formed by combining an n-channel TFT 601 and a p-channel TFT 602 (see FIG. 14).

The pixel electrode 711 functions as the anode of the light emitting element. Further, the banks 712 are formed on both sides of the pixel electrode 711, and the light emitting layer 713 and the cathode 714 of the light emitting element are formed on the pixel electrode 711.

The cathode 714 functions as a common wiring to all the pixels, and is electrically connected to the FPC 905 through the connection wiring 904. Further, all the elements contained in the pixel portion 806 and the gate side driver circuit 807 are covered by the cathode 714 and the passivation film 716.

Further, the covering member 901 is bonded by the first sealing member 902. Note that a spacer made of a resin film may be provided in order to secure the interval between the covering member 901 and the light emitting element. The inside of the first sealing member 902 is filled with the sealing material 907. Note that an epoxy-based resin is preferably used for the first sealing member 902 and the sealing material 907. Further, it is desirable that the first sealing member 902 is made from a material that is not penetrated by moisture and oxygen as much as possible. Moreover, the substance having an absorbing effect or the substance having an oxidization preventing effect may be provided in the sealing material 907.

The sealing material 907 provided so as to cover the light emitting element also functions as an adhesive for adhering the covering member 901. Further, FRP (fiberglass-reinforced plastics), PVF (polyvinyl fluoride), Mylar, polyester or acrylic can be used as the material for a plastic substrate 901a constituting the covering member 901 in this embodiment.

Further, after the covering member 901 is adhered by using the sealing material 907, the second sealing member 903 is provided so as to cover the side surface (exposing surface) of the sealing material 907. The material for the first sealing member 902 may be used also for the second sealing member 903.

The light emitting element is sealed into the sealing material 907 with the above structure, whereby the light emitting element can be completely shut out from the outside. Thus, the substances that promote the deterioration due to oxidization of the light emitting layer such as moisture and oxygen can be prevented from permeating the light emitting element from the outside. Therefore, the light emitting device with high reliability can be obtained.

Note that this embodiment can be freely combined with any one of Embodiments 1 to 5.

Embodiment 8

In this embodiment, another example of an active matrix substrate with a different TFT structure is given, and a method of manufacturing a liquid crystal display device is described with reference to FIGS. 17 and 18.

Figure 17:
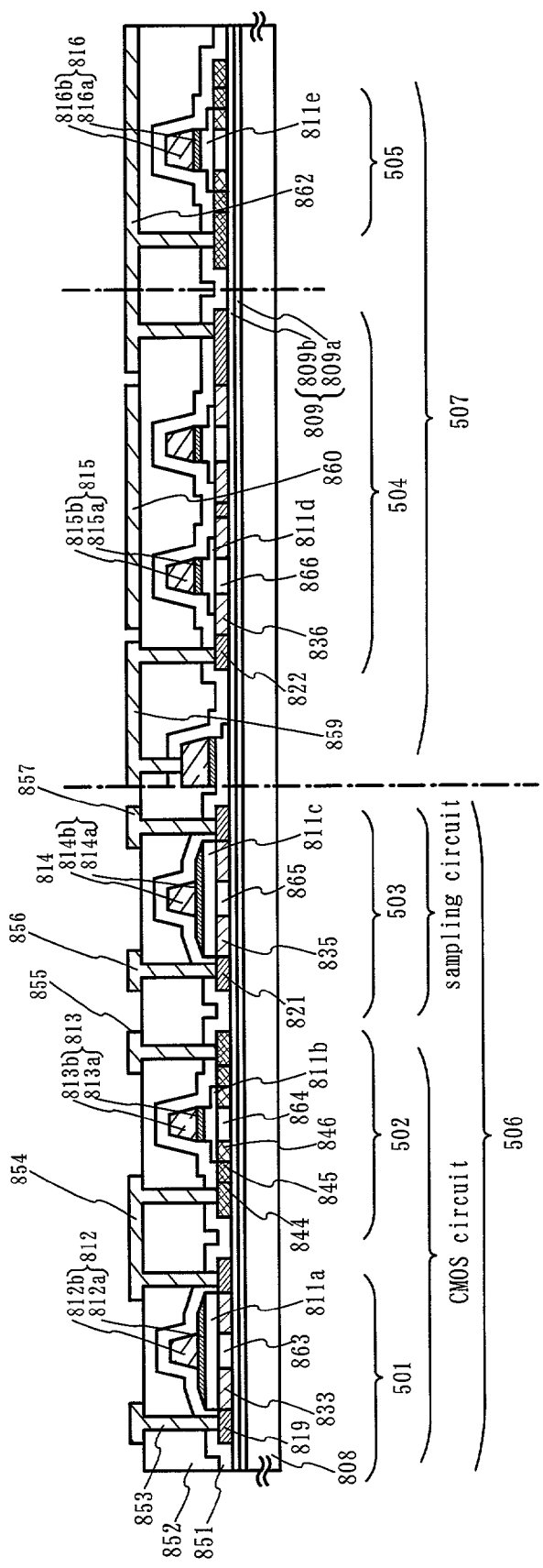
FIG. 17 is a cross sectional view showing an example of a manufacturing process of a pixel TFT and TFTs of a driver circuit.

The active matrix substrate shown in FIG. 17 is constituted of: a driver circuit 506 having a CMOS circuit portion composed of an n-channel TFT 501 and a p-channel TFT 502 and a sampling circuit that consists of an n-channel TFT 503; and a pixel portion 507 having a pixel TFT 504 and a storage capacitance 505. The TFTs of the CMOS circuit of the driver circuit 506 constitute a shift register circuit, a buffer circuit and the like, and the TFT of the sampling circuit basically constitutes an analog switch.

After a base film 809 is formed on a substrate 808, a channel forming region, a source region, a drain region, an LDD region and the like are provided in a semiconductor layer on the base film to thereby form the above TFTs. The base film is formed in the same manner as in Embodiments 1 to 3, and the semiconductor layer is formed in the same manner as in Embodiments 1 to 3 according to the present invention.

Gate electrodes 812 to 816 formed on a gate insulating film 811 each have a lamination structure of a first conductive layer and a second conductive layer, and there is a characteristic that the lamination structure is formed to have a tapered shape at the end portion. The shape is formed by conducting etching at least three times. An impurity is introduced into the semiconductor layer by utilizing the shape of the gate electrode formed by the above etching.

Specifically, the gate electrode having a first shape in which the end portion has the tapered shape by a first etching process is used as a mask, and a first doping process is conducted in a self-aligning manner to thereby form a high concentration impurity region. Next, the second conductive layer is selectively etched to form the gate electrode having a second shape. A second doping process is performed by utilizing the tapered portion of the first conductive layer of the second shape gate electrode to thereby form a low concentration impurity region. Then, a mask is provided in the semiconductor layer in which the n-channel TFT is manufactured, and the first conductive layers of the p-channel TFT and the pixel portion are selectively etched to form the gate electrode having a third shape. Then, the gate insulating film is etched using the third shape gate electrode as a mask. Subsequently, masks are provided in the n-channel TFTs and the pixel portion, and a third doping process is conducted. By the third doping process, an impurity region added with an impurity element imparting an opposite conductivity to the above one conductivity is formed in the semiconductor layer that becomes an active layer of the p-channel TFT.

The LDD region formed by utilizing the tapered portion of the first conductive layer of the second shape gate electrode is provided for an improvement in reliability of the n-channel TFT, whereby the deterioration of an on current due to a hot-carrier effect is prevented. In the LDD region, ions of the impurity element, which are accelerated in an electric field by an ion doping method, are added to the semiconductor film through the end portion of the gate electrode and the gate insulating film in the vicinity of the end portion.

As described above, in the n-channel TFT 501, an LDD region 833 and a source or drain region 819 are formed external to a channel forming region 863, and the LDD region 833 is formed so as to overlap the gate electrode 812. The n-channel TFT 503 has the same structure, and is constituted of a channel forming region 865, an LDD region 835 overlapping the gate electrode and a source or drain region 821. On the other hand, the p-channel TFT 502 is constituted of a channel forming region 864, and an LDD region 846 and source or drain regions 845 and 844, which are external to the channel forming region 864.

In the pixel portion 507, the pixel TFT formed of an n-channel TFT is formed with a multi-gate structure for the purpose of reducing an off current, and an LDD region 836 and a source or drain region 822 are provided external to a channel forming region 866. Further, the storage capacitance 505 is constituted of a semiconductor layer, an insulating layer formed of the same layer of the gate insulating film 811 and a capacitance wiring 816. The semiconductor layer is added with an impurity element, and a voltage applied to the capacitance wiring can be suppressed low because of the low resistivity.

An interlayer insulating film is constituted of a first interlayer insulating film 851 with a thickness of 50 to 500 nm, which is formed from an inorganic material such as silicon oxide, silicon nitride or silicon oxynitride and a second interlayer insulating film 852 which is formed from an organic insulating material such as polyimide, acrylic, polyimideamide or BCB (benzocyclobutene). As described above, the second interlayer insulating film is formed from the organic insulating material, whereby the surface can be made flat satisfactorily. Further, since an organic resin material generally has a low permittivity, a parasitic capacitance can be reduced. However, the organic resin material has an absorbing property, and thus is not suitable for a protective film. Therefore, it is preferable that the second interlayer insulating film 852 is formed by being combined with the first interlayer insulating film 851.

Thereafter, a resist mask with a predetermined pattern is formed, and a contact hole that reaches the source or drain region formed in each semiconductor layer is formed. The formation of the contact hole is conducted by a dry etching method. In this case, the second interlayer insulating film 852 comprised of the organic resin material is etched first by using a gas mixture of $CF_4$, $O_2$ and He, and then, the first interlayer insulating film 851 is etched with etching gases of $CF_4$ and $O_2$.

Then, a conductive metal film is formed by a sputtering method or a vacuum evaporation method, a resist mask pattern is formed, and source regions and drain wirings 853 to 857, a pixel electrode 862, a gate wiring 860 and a connection wiring 859 are formed by etching. Thus, the active matrix substrate can be formed.

Figure 18:
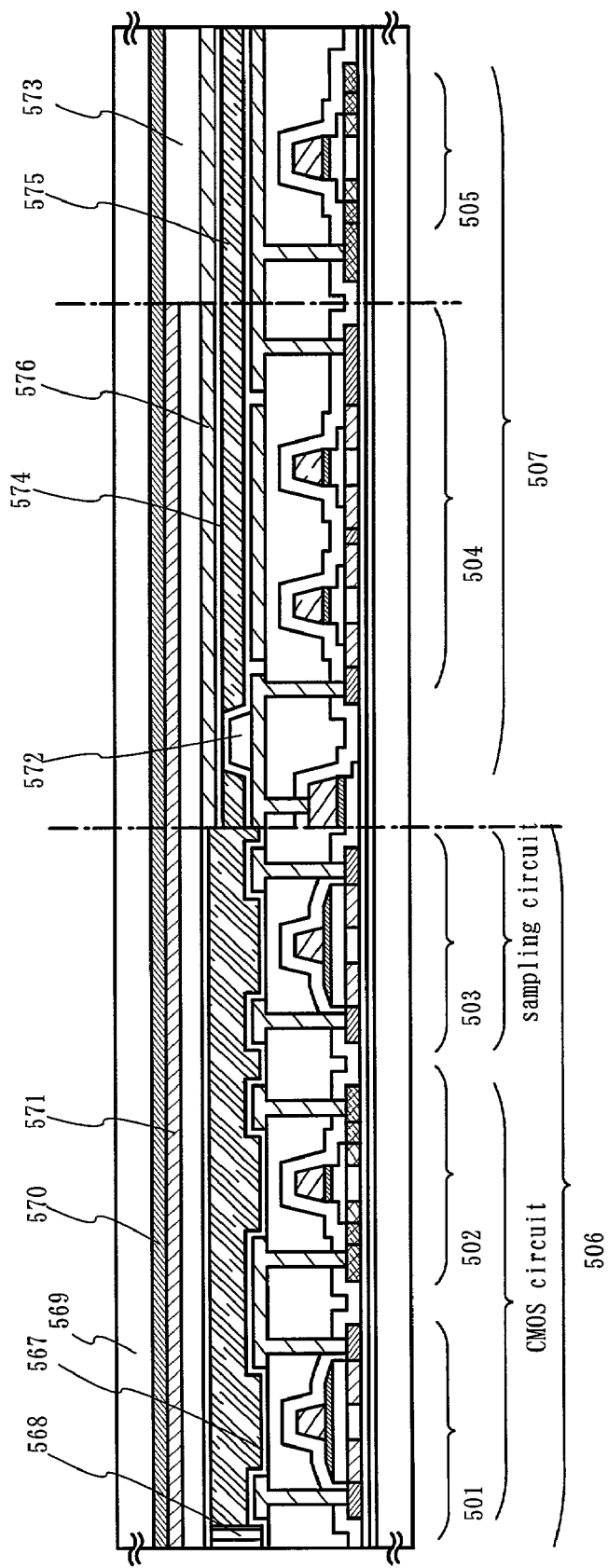
FIG. 18 is a cross sectional view showing a manufacturing process of an active matrix liquid crystal display device.

Then, an orientation film 567 is formed at least on the pixel electrode 862 on the active matrix substrate in FIG. 17, and a rubbing process is conducted (FIG. 18). Note that, in this embodiment, a columnar spacer 572 for keeping an interval between substrates is formed at a desired position by patterning an organic resin film such as an acrylic resin film before the orientation film 567 is formed. Further, instead of the columnar spacer, spherical spacers may be scattered over the entire surface of the substrate.

Next, an opposing substrate 569 is prepared. Then, coloring layers 570 and 571 and a leveling film 573 are formed on the opposing substrate 569. The red coloring layer 570 and the blue coloring layer 571 are overlapped with each other to form a light shielding portion. Further, the red coloring layer and the blue coloring layer may also be partially overlapped with each other to form a light shielding portion.

As described above, a light shielding layer such as a black mask is not formed, and gaps between pixels are shielded by the light shielding portion comprised of the lamination layer of the coloring layers. Thus, a reduction of the number of steps is enabled.

Subsequently, an opposing electrode 576 comprised of a transparent conductive film is formed on the leveling film 573 at least in the pixel portion, an orientation film 574 is formed over the entire surface of the opposing substrate, and a rubbing process is conducted.

Then, the active matrix substrate in which the pixel portion and the driver circuit are formed and the opposing substrate are bonded to each other by a sealing member 568. The sealing member 568 is mixed with filler, and the two substrates are bonded to each other with a uniform interval by the filler and the columnar spacer. Thereafter, a liquid crystal material 575 is injected between both the substrates, and the substrates are completely sealed by a sealing material (not shown). A known liquid crystal material may be used as the liquid crystal material 575. Thus, a reflection type liquid crystal display device in FIG. 18 is completed. If necessary, the active matrix substrate or the opposing substrate is cut into a desired shape. Further, a polarizing plate (not shown) is bonded only to the opposing substrate. Then, an FPC is attached by using a known technique.

A liquid crystal display panel manufactured as described above can be used as a display portion for various types of electronic equipment.

Note that this embodiment can be freely combined with any one of Embodiments 1 to 5.

Embodiment 9

The CMOS circuit and the pixel portion formed by implementing the present invention can be applied to various electro-optical equipments (active matrix liquid crystal display device, active matrix EC display device, and active matrix light-emitting display device). Thus the present invention can be applied to all of the electronic equipments having these electro-optical devices as the display portion.

The following can be given as examples of the electronic equipment: video cameras; digital cameras; projectors; head mounted displays (goggle type display); car navigation systems; car stereo; personal computers; portable information terminals (such as mobile computers, portable telephones and electronic notebook). An example of these is shown in FIGS. 19, 20 and 21.

Figure 19A:
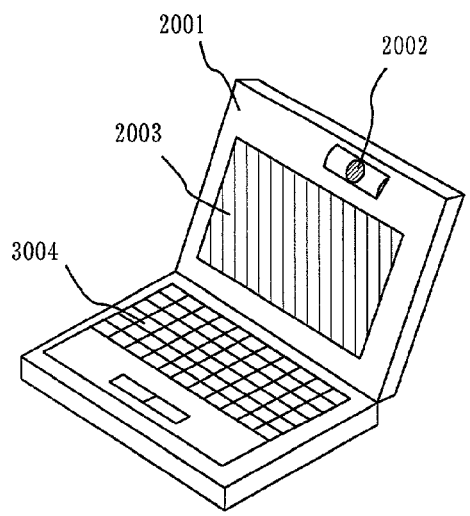
FIGS. 19A to 19F show examples of semiconductor devices.

FIG. 19A shows a personal computer, and it includes a main body 2001, an image input section 2002, a display portion 2003, and a keyboard 2004. The personal computer of the present invention is completed by applying the semiconductor device of the present invention to the display portion 2003.

Figure 19B:
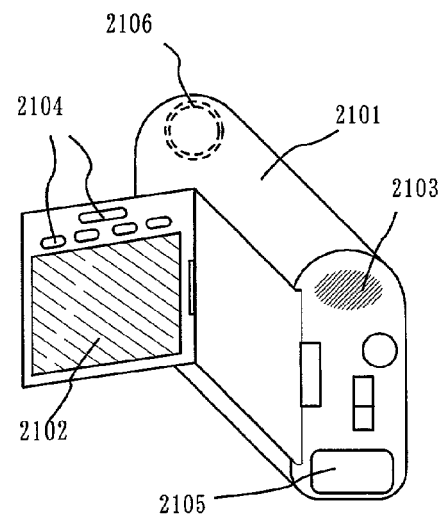

FIG. 19B shows a video camera, and it includes a main body 2101, a display portion 2102, a voice input section 2103, operation switches 2104, a battery 2105, and an image receiving section 2106. The video camera of the present invention is completed by applying the semiconductor device of the present invention to the display portion 2102.

Figure 19C:
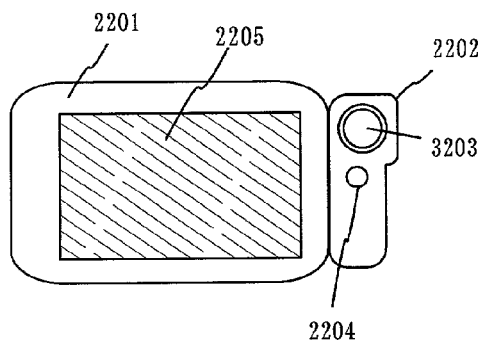

FIG. 19C shows a mobile computer, and it includes a main body 2201, a camera section 2202, an image receiving section 2203, operation switches 2204, and a display portion 2205. The mobile computer of the present invention is completed by applying the semiconductor device of the present invention to the display portion 2205.

Figure 19D:
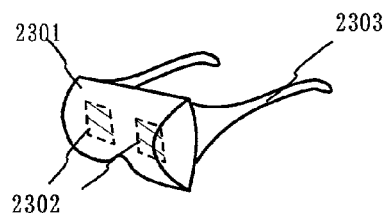

FIG. 19D shows a goggle type display, and it includes a main body 2301; a display portion 2302; and an arm section 2303. The goggle type display of the present invention is completed by applying the semiconductor device of the present invention to the display portion 2302.

Figure 19E:
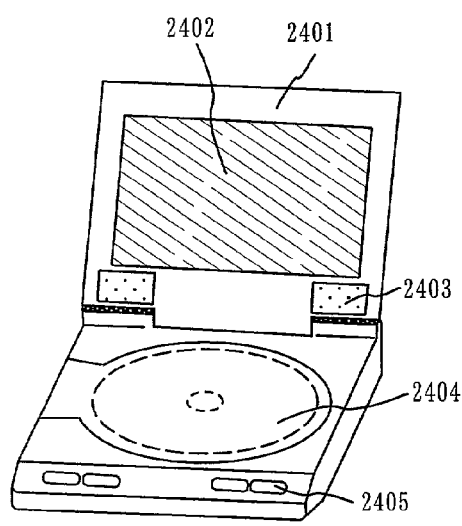

FIG. 19E shows a player using a recording medium which records a program (hereinafter referred to as a recording medium), and it includes a main body 2401; a display portion 2402; a speaker section 2403; a recording medium 2404; and operation switches 2405. This player uses DVD (digital versatile disc), CD, etc. for the recording medium, and can be used for music appreciation, film appreciation, games and Internet. The recording medium of the present invention is completed by applying the semiconductor device of the present invention to the display portion 2402.

Figure 19F:
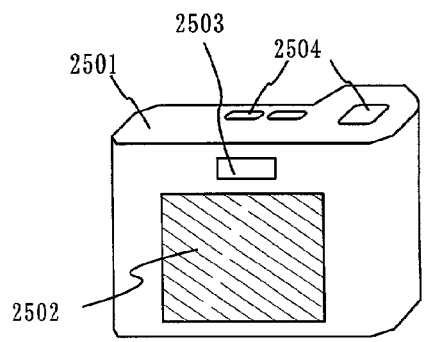

FIG. 19F shows a digital camera, and it includes a main body 2501; a display portion 2502; a view finder 2503; operation switches 2504; and an image receiving section (not shown in the figure). The digital camera of the present invention is completed by applying the semiconductor device of the present invention to the display portion 2502.

Figure 20A:
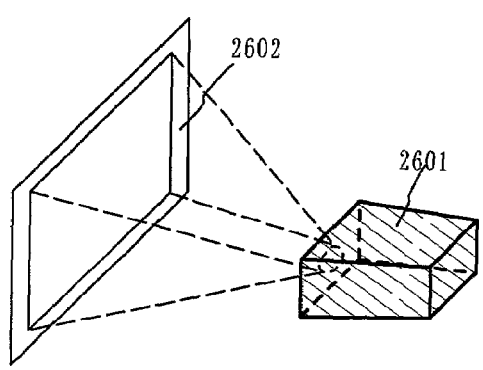
FIGS. 20A to 20D show examples of semiconductor devices.

FIG. 20A is a front-type projector, and it includes a projection device 2601 and a screen 2602. The front-type projector of the present invention is completed by applying the semiconductor device of the present invention to the liquid crystal display device 2808 which comprises one of the projection device 2601, and to other driver circuits.

Figure 20B:
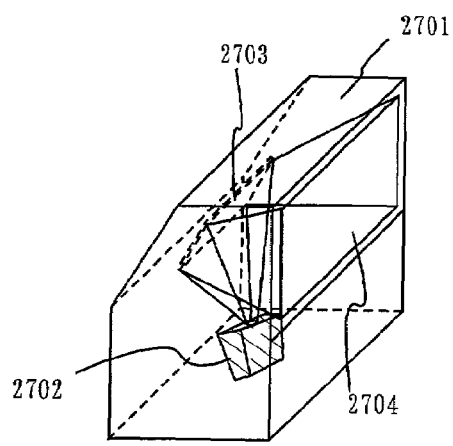

FIG. 20B is a rear-type projector, and it includes a main body 2701, a projection device 2702, a mirror 2703, and a screen 2704. The rear-type projector of the present invention is completed by applying the semiconductor device of the present invention to the liquid crystal display device 2808 which comprises one of the projection device 2702, and to other driver circuits.

Figure 20C:
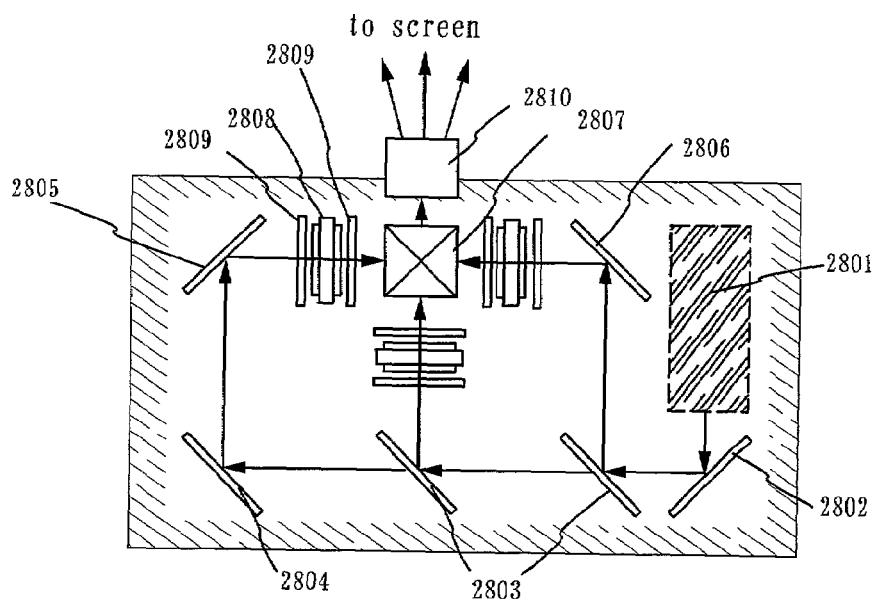

FIG. 20C is a diagram showing an example of the structure of the projection devices 2601, 2702 in FIGS. 20A and 20B. The projection device 2601 or 2702 comprises a light source optical system 2801, mirrors 2802, 2804 to 2806, dichroic mirrors 2803, a prism 2807, liquid crystal display devices 2808, phase difference plates 2809, and a projection optical system 2810. The projection optical system 2810 is composed of an optical system including a projection lens. This example shows an example of three-plate type but not particularly limited thereto. For instance, the invention may be applied also to a single plate type optical system. Further, in the light path indicated by an arrow in FIG. 20C, an optical system such as an optical lens, a film having a polarization function, a film for adjusting a phase difference, and an IR film may be suitably provided by a person who carries out the invention.

Figure 20D:
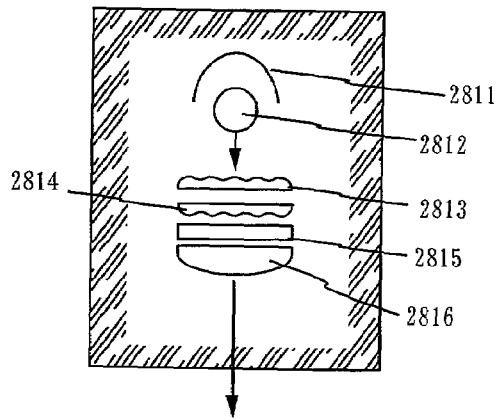

FIG. 20D is a diagram showing an example of the structure of the light source optical system 2801 in FIG. 20C. In this embodiment, the light source optical system 2801 comprises a reflector 2811, a light source 2812, lens arrays 2813, 2814, a polarization conversion element 2815, and a condenser lens 2816. The light source optical system shown in FIG. 20D is merely an example, and is not particularly limited to the illustrated structure. For example, a person who carries out the invention is allowed to suitably add to the light source optical system an optical system such as an optical lens, a film having a polarization function, a film for adjusting a phase difference, and an IR film.

Note that a transmission electro-optical device is used as the projector shown in FIG. 20, a reflection type electro-optical device is not illustrated.

Figure 21A:
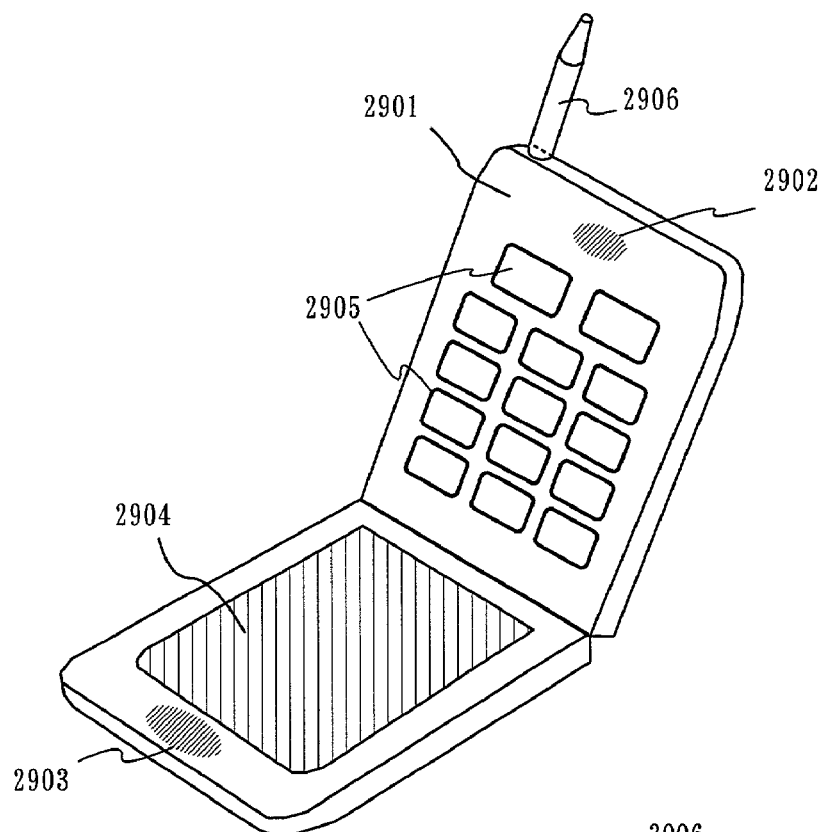
FIGS. 21A to 21C show examples of semiconductor devices.

FIG. 21A is a portable telephone, and it includes a main body 2901, an audio output section 2902, an audio input section 2903, a display portion 2904, operation switches 2905, and an antenna 2906. The portable telephone of the present invention is completed by applying the semiconductor device of the present invention to the display portion 2904.

Figure 21B:
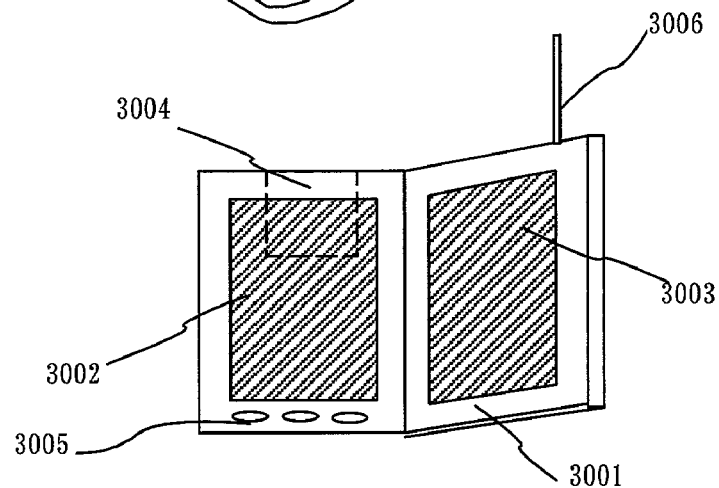

FIG. 21B is a portable book (electronic book), and it includes a main body 3001, display portions 3002 and 3003, a recording medium 3004, operation switches 3005, and an antenna 3006. The portable book of the present invention is completed by applying the semiconductor device of the present invention to the display portions 3002 and 3003.

Figure 21C:
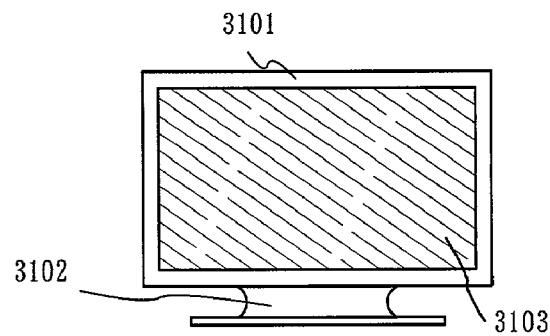

FIG. 21C is a display, and it includes a main body 3101, a support stand 3102, and a display portion 3103. The present invention can be applied to the display portion 3103. The display of the present invention is advantageous for a large size screen in particular, and is advantageous for a display equal to or greater than 10 inches (especially equal to or greater than 30 inches) in diagonal.

The applicable range of the present invention is thus extremely wide, and it is possible to apply the present invention to electronic equipment in all fields. Further, the electronic equipment of Embodiment 3 can be realized by using a constitution of any combination of Embodiments 1 to 7, 8 or 9.

The structure of the present invention is adopted, whereby the following significance can be obtained.

(a) The structure is a simple one that is completely applied to the manufacturing process of the conventional TFT.

(b) The general laser irradiation apparatus can be used as it is.

(c) The running cost of the laser irradiation apparatus can be reduced.

(d) There is obtained the method of manufacturing crystal grains of large grain size or position-controlled crystal grains of large grain size with the satisfied advantages that are described above.

What is claimed is:

1. A laser irradiation method comprising the steps of;
   irradiating a first laser beam from a front surface of a substrate on which a member to be irradiated is formed; and
   irradiating a second laser beam from a rear surface of the substrate,
   wherein the second laser beam is a part of the first laser beam which has penetrated the member to be irradiated and the substrate and is reflected by a reflecting member, and wherein the reflective member comprises a patterned reflective layer.

2. A laser irradiation method according to claim 1, wherein a surface of the reflecting member on which the first laser beam is reflected is a curved surface.

3. A laser irradiation method according to claim 1, wherein wavelengths of the first laser beam and the second laser beam each are 350 nm or more.

4. A laser irradiation method according to claim 1, wherein the first laser beam is emitted from at least one selected from the group consisting of a YAG laser, a $YVO_4$ laser, a YLF laser, a $YAlO_3$ laser, a glass laser, a ruby laser, an alexandrite laser and a Ti:sapphire laser of continuous oscillation type or pulse oscillation type.

5. A laser irradiation method according to claim 1, wherein the first laser beam is converted into harmonic by a nonlinear optical element.

6. A laser irradiation method comprising the steps of:
disposing a reflecting member on a rear surface side of a substrate on which a member to be irradiated is formed;
irradiating a first laser beam from a front surface of the substrate; and
irradiating a second laser beam from a rear surface of the substrate,
wherein the second laser beam is a part of the first laser beam which has penetrated the member to be irradiated and the substrate and is reflected by the reflecting member, and
wherein the reflective member comprises a patterned reflective layer.

7. A laser irradiation method according to claim 6, wherein a surface of the reflecting member on which the first laser beam is reflected is a curved surface.

8. A laser irradiation method according to claim 6, wherein wavelengths of the first laser beam and the second laser beam each are 350 nm or more.

9. A laser irradiation method according to claim 6, wherein the first laser beam is emitted from at least one selected from the group consisting of a YAG laser, a $YVO_4$ laser, a YLF laser, a $YAlO_3$ laser, a glass laser, a ruby laser, an alexandrite laser and a Ti:sapphire laser of continuous oscillation type or pulse oscillation type.

10. A laser irradiation method according to claim 6, wherein the first laser beam is converted into harmonic by a nonlinear optical element.

11. A laser irradiation method comprising the steps of:
irradiating a first laser beam from a front surface of a substrate on which a member to be irradiated is formed; and
irradiating a second laser beam from a rear surface of the substrate,
wherein the second laser beam is a part of the first laser beam which has penetrated the member to be irradiated and the substrate and is reflected by a reflecting member,
wherein the substrate and the reflecting member are irradiated while relatively moving with respect to the first laser beam and the second laser beam, and
wherein the reflective member comprises a patterned reflective layer.

12. A laser irradiation method according to claim 11, wherein a surface of the reflecting member on which the first laser beam is reflected is a curved surface.

13. A laser irradiation method according to claim 11, wherein wavelengths of the first laser beam and the second laser beam each are 350 nm or more.

14. A laser irradiation method according to claim 11, wherein the first laser beam is emitted from at least one selected from the group consisting of a YAG laser, a $YVO_4$ laser, a YLF laser, a $YAlO_3$ laser, a glass laser, a ruby laser, an alexandrite laser and a Ti:sapphire laser of continuous oscillation type or pulse oscillation type.

15. A laser irradiation method according to claim 11, wherein the first laser beam is converted into harmonic by a nonlinear optical element.

16. A laser irradiation method comprising the steps of:
disposing a reflecting member on a rear surface side of a substrate on which a member to be irradiated is formed;
irradiating a first laser beam from a front surface of the substrate; and
irradiating a second laser beam from a rear surface of the substrate,
wherein the second laser beam is a part of the first laser beam which has penetrated the member to be irradiated and the substrate and is reflected by the reflecting member,
wherein the substrate and the reflecting member are irradiated while relatively moving with respect to the first laser beam and the second laser beam, and
wherein the reflective member comprises a patterned reflective layer.

17. A laser irradiation method according to claim 16, wherein a surface of the reflecting member on which the first laser beam is reflected is a curved surface.

18. A laser irradiation method according to claim 16, wherein wavelengths of the first laser beam and the second laser beam each are 350 nm or more.

19. A laser irradiation method according to claim 16, wherein the first laser beam is emitted from at least one selected from the group consisting of a YAG laser, a $YVO_4$ laser, a YLF laser, a $YAlO_3$ laser, a glass laser, a ruby laser, an alexandrite laser and a Ti:sapphire laser of continuous oscillation type or pulse oscillation type.

20. A laser irradiation method according to claim 16, wherein the first laser beam is converted into harmonic by a nonlinear optical element.

21. A laser irradiation method comprising the steps of:
irradiating a first laser beam from a front surface of a substrate on which a member to be irradiated is formed; and
irradiating a second laser beam from a rear surface of the substrate,
wherein the second laser beam is a part of the first laser beam which has penetrated the member to be irradiated and the substrate and is reflected by a reflecting member,
wherein the substrate is irradiated while relatively moving with respect to the first laser beam, the second laser beam and the reflecting member, and
wherein the reflective member comprises a patterned reflective layer.

22. A laser irradiation method according to claim 21, wherein a surface of the reflecting member on which the first laser beam is reflected is a curved surface.

23. A laser irradiation method according to claim 21, wherein wavelengths of the first laser beam and the second laser beam each are 350 nm or more.

24. A laser irradiation method according to claim 21, wherein the first laser beam is emitted from at least one selected from the group consisting of a YAG laser, a $YVO_4$ laser, a YLF laser, a $YAlO_3$ laser, a glass laser, a ruby laser, an alexandrite laser and a Ti:sapphire laser of continuous oscillation type or pulse oscillation type.

25. A laser irradiation method according to claim 21, wherein the first laser beam is converted into harmonic by a nonlinear optical element.

26. A laser irradiation method comprising the steps of:
disposing a reflecting member on a rear surface side of a substrate on which a member to be irradiated is formed;
irradiating a first laser beam from a front surface of the substrate; and
irradiating a second laser beam from a rear surface of the substrate,
wherein the second laser beam is a part of the first laser beam which has penetrated the member to be irradiated and the substrate and is reflected by the reflecting member,
wherein the substrate is irradiated while relatively moving with respect to the first laser beam, the second laser beam and the reflecting member, and
wherein the reflective member comprises a patterned reflective layer.

27. A laser irradiation method according to claim 26, wherein a surface of the reflecting member on which the first laser beam is reflected is a curved surface.

28. A laser irradiation method according to claim 26, wherein wavelengths of the first laser beam and the second laser beam each are 350 nm or more.

29. A laser irradiation method according to claim 26, wherein the first laser beam is emitted from at least one selected from the group consisting of a YAG laser, a YVO$_4$ laser, a YLF laser, a YAlO$_3$ laser, a glass laser, a ruby laser, an alexandrite laser and a Ti:sapphire laser of continuous oscillation type or pulse oscillation type.

30. A laser irradiation method according to claim 26, wherein the first laser beam is converted into harmonic by a nonlinear optical element.

31. A method of manufacturing the semiconductor device comprising the steps of:
irradiating a semiconductor film with a first laser beam from a front surface of a substrate, wherein the semiconductor film is formed over the entire front surface of a substrate; and
irradiating the semiconductor film with a second laser beam from a rear surface of the substrate,
wherein the second laser beam is a part of the first laser beam which has penetrated the semiconductor film and the substrate and is reflected by a reflecting member.

32. A method of manufacturing a semiconductor device according to claim 31, wherein wavelengths of the first laser beam and the second laser beam each are 350 nm or more.

33. A method of manufacturing a semiconductor device according to claim 31, wherein the first laser beam is emitted from at least one selected from the group consisting of a YAG laser, a YVO$_4$ laser, a YLF laser, a YAlO$_3$ laser, a glass laser, a ruby laser, an alexandrite laser and a Ti:sapphire laser of continuous oscillation type or pulse oscillation type.

34. A method of manufacturing a semiconductor device according to claim 31, wherein the first laser beam is converted into harmonic by a nonlinear optical element.

35. A method of manufacturing a semiconductor device according to claim 31, wherein the semiconductor device is at least one selected from the group consisting of: a personal computer, a video camera, a mobile computer, a goggle type display, a player using a recording medium, a digital camera, a projector, a portable phone and a portable book.

36. A method of manufacturing the semiconductor device comprising the steps of:
disposing a reflecting member on a rear surface side of a substrate;
irradiating a semiconductor film with a first laser beam from a front surface of the substrate, wherein the semiconductor film is formed over the entire front surface of the substrate; and
irradiating the semiconductor film with a second laser beam from the rear surface of the substrate,
wherein the second laser beam is a part of the first laser beam which has penetrated the semiconductor film and the substrate and is reflected by the reflecting member.

37. A method of manufacturing a semiconductor device according to claim 36, wherein wavelengths of the first laser beam and the second laser beam each are 350 nm or more.

38. A method of manufacturing a semiconductor device according to claim 36, wherein the first laser beam is emitted from at least one selected from the group consisting of a YAG laser, a YVO$_4$ laser, a YLF laser, a YAlO$_3$ laser, a glass laser, a ruby laser, an alexandrite laser and a Ti:sapphire laser of continuous oscillation type or pulse oscillation type.

39. A method of manufacturing a semiconductor device according to claim 36, wherein the first laser beam is converted into harmonic by a nonlinear optical element.

40. A method of manufacturing a semiconductor device according to claim 36, wherein the semiconductor device is at least one selected from the group consisting of: a personal computer, a video camera, a mobile computer, a goggle type display, a player using a recording medium, a digital camera, a projector, a portable phone and a portable book.

41. A method of manufacturing the semiconductor device comprising the steps of:
irradiating a semiconductor film with a first laser beam from a front surface of a substrate, wherein the semiconductor film is formed over the entire front surface of the substrate; and
irradiating the semiconductor film with a second laser beam from a rear surface of the substrate,
wherein the second laser beam is a part of the first laser beam which has penetrated the semiconductor film and the substrate and is reflected by a reflecting member,
wherein the substrate and the reflecting member are irradiated while relatively moving with respect to the first laser beam and the second laser beam.

42. A method of manufacturing a semiconductor device according to claim 41, wherein wavelengths of the first laser beam and the second laser beam each are 350 nm or more.

43. A method of manufacturing a semiconductor device according to claim 41, wherein the first laser beam is emitted from at least one selected from the group consisting of a YAG laser, a YVO$_4$ laser, a YLF laser, a YAlO$_3$ laser, a glass laser, a ruby laser, an alexandrite laser and a Ti:sapphire laser of continuous oscillation type or pulse oscillation type.

44. A method of manufacturing a semiconductor device according to claim 41, wherein the first laser beam is converted into harmonic by a nonlinear optical element.

45. A method of manufacturing a semiconductor device according to claim 41, wherein the semiconductor device is at least one selected from the group consisting of: a personal computer, a video camera, a mobile computer, a goggle type display, a player using a recording medium, a digital camera, a projector, a portable phone and a portable book.

46. A method of manufacturing the semiconductor device comprising the steps of:
disposing a reflecting member on a rear surface side of a substrate;
irradiating a semiconductor film with a first laser beam from a front surface of the substrate, wherein the semiconductor film is formed over the entire front surface of the substrate; and irradiating the semiconductor film with a second laser beam from a rear surface of the substrate, wherein the second laser beam is a part of the first laser beam which has penetrated the semiconductor film and the substrate and is reflected by the reflecting member, wherein the substrate and the reflecting member are irradiated while relatively moving with respect to the first laser beam and the second laser beam.

47. A method of manufacturing a semiconductor device according to claim 46, wherein wavelengths of the first laser beam and the second laser beam each are 350 nm or more.

48. A method of manufacturing a semiconductor device according to claim 46, wherein the first laser beam is emitted from at least one selected from the group consisting of a YAG laser, a $YVO_4$ laser, a YLF laser, a $YAlO_3$ laser, a glass laser, a ruby laser, an alexandrite laser and a Ti:sapphire laser of continuous oscillation type or pulse oscillation type.

49. A method of manufacturing a semiconductor device according to claim 46, wherein the first laser beam is converted into harmonic by a nonlinear optical element.

50. A method of manufacturing a semiconductor device according to claim 46, wherein the semiconductor device is at least one selected from the group consisting of: a personal computer, a video camera, a mobile computer, a goggle type display, a player using a recording medium, a digital camera, a projector, a portable phone and a portable book.

51. A method of manufacturing the semiconductor device comprising the steps of:

irradiating a semiconductor film with a first laser beam from a front surface of a substrate, wherein the semiconductor film is formed over the entire front surface of the substrate; and irradiating the semiconductor film with a second laser beam from a rear surface of the substrate, wherein the second laser beam is a part of the first laser beam which has penetrated the semiconductor film and the substrate and is reflected by a reflecting member, wherein the substrate is irradiated while relatively moving with respect to the first laser beam, the second laser beam and the reflecting member.

52. A method of manufacturing a semiconductor device according to claim 51, wherein wavelengths of the first laser beam and the second laser beam each are 350 nm or more.

53. A method of manufacturing a semiconductor device according to claim 51, wherein the first laser beam is emitted from at least one selected from the group consisting of a YAG laser, a $YVO_4$ laser, a YLF laser, a $YAlO_3$ laser, a glass laser, a ruby laser, an alexandrite laser and a Ti:sapphire laser of continuous oscillation type or pulse oscillation type.

54. A method of manufacturing a semiconductor device according to claim 51, wherein the first laser beam is converted into harmonic by a nonlinear optical element.

55. A method of manufacturing a semiconductor device according to claim 51, wherein the semiconductor device is at least one selected from the group consisting of: a personal computer, a video camera, a mobile computer, a goggle type display, a player using a recording medium, a digital camera, a projector, a portable phone and a portable book.

56. A method of manufacturing the semiconductor device comprising the steps of:

disposing a reflecting member on a rear surface side of a substrate;

irradiating a semiconductor film with a first laser beam from a front surface of the substrate, wherein the semiconductor film is formed over the entire front surface of the substrate; and irradiating a second laser beam from a rear surface of the substrate, wherein the second laser beam is a part of the first laser beam which has penetrated the semiconductor film and the substrate and is reflected by the reflecting member, wherein the substrate is irradiated while relatively moving with respect to the first laser beam, the second laser beam and the reflecting member.

57. A method of manufacturing a semiconductor device according to claim 56, wherein wavelengths of the first laser beam and the second laser beam each are 350 nm or more.

58. A method of manufacturing a semiconductor device according to claim 56, wherein the first laser beam is emitted from at least one selected from the group consisting of a YAG laser, a $YVO_4$ laser, a YLF laser, a $YAlO_3$ laser, a glass laser, a ruby laser, an alexandrite laser and a Ti:sapphire laser of continuous oscillation type or pulse oscillation type.

59. A method of manufacturing a semiconductor device according to claim 56, wherein the first laser beam is converted into harmonic by a nonlinear optical element.

60. A method of manufacturing a semiconductor device according to claim 56, wherein the semiconductor device is at least one selected from the group consisting of: a personal computer, a video camera, a mobile computer, a goggle type display, a player using a recording medium, a digital camera, a projector, a portable phone and a portable book.

* * * * *